United States Patent [19] [11] Patent Number: 6,114,864
Soejima et al. [45] Date of Patent: Sep. 5, 2000

[54] PROBE CARD WITH PLURAL PROBE TIPS ON A UNITARY FLEXIBLE TONGUE

[75] Inventors: Koji Soejima; Naoji Senba, both of Tokyo, Japan

[73] Assignee: NEC Corporation, Tokyo, Japan

[21] Appl. No.: 08/833,221

[22] Filed: Apr. 14, 1997

[30] Foreign Application Priority Data

Apr. 15, 1996 [JP] Japan .................................. 8-092079

[51] Int. Cl.[7] ............................ G01R 1/073; G01R 31/26
[52] U.S. Cl. ............................................ 324/754; 324/72.5
[58] Field of Search ................................... 324/754, 757, 324/758, 761, 762, 72.5

[56] References Cited

U.S. PATENT DOCUMENTS

| 3,826,984 | 7/1974 | Epple . |
| 4,961,052 | 10/1990 | Tada et al. ............................... 324/754 |
| 4,968,589 | 11/1990 | Perry . |
| 5,134,365 | 7/1992 | Okubo et al. . |
| 5,172,050 | 10/1992 | Swapp ..................................... 324/72.5 |
| 5,191,708 | 3/1993 | Kasukabe et al. . |
| 5,444,386 | 8/1995 | Mizumura . |

FOREIGN PATENT DOCUMENTS

| 0 646 800 | 4/1995 | European Pat. Off. . |
| 61-2338 | 1/1986 | Japan . |
| 4-297050 | 10/1992 | Japan . |
| 6-18555 | 1/1994 | Japan . |
| 6-50990 | 2/1994 | Japan . |
| 6-347481 | 12/1994 | Japan . |
| 6-349907 | 12/1994 | Japan . |
| 7-21598 | 1/1995 | Japan . |
| 7-083955 | 3/1995 | Japan . |
| 7-74219 | 3/1995 | Japan . |
| 7-135240 | 5/1995 | Japan . |
| 7-142541 | 6/1995 | Japan . |
| 8-50146 | 2/1996 | Japan . |
| WO 96/41506 | 12/1996 | WIPO . |

*Primary Examiner*—Walter E. Snow
*Attorney, Agent, or Firm*—Young & Thompson

[57] ABSTRACT

A probe card comprises the following elements. An insulation film is provided which is flexible and extends on a first surface of a substrate. The insulation film has a first surface in contact with the first surface of the substrate, to form a space region which is defined between the first surface of the substrate and the first surface of the insulation film so as to allow part of the insulation film to move into the space. Probe patterns extend on a second surface of the insulation film so that the probe patterns.

29 Claims, 24 Drawing Sheets

F I G. 1 0
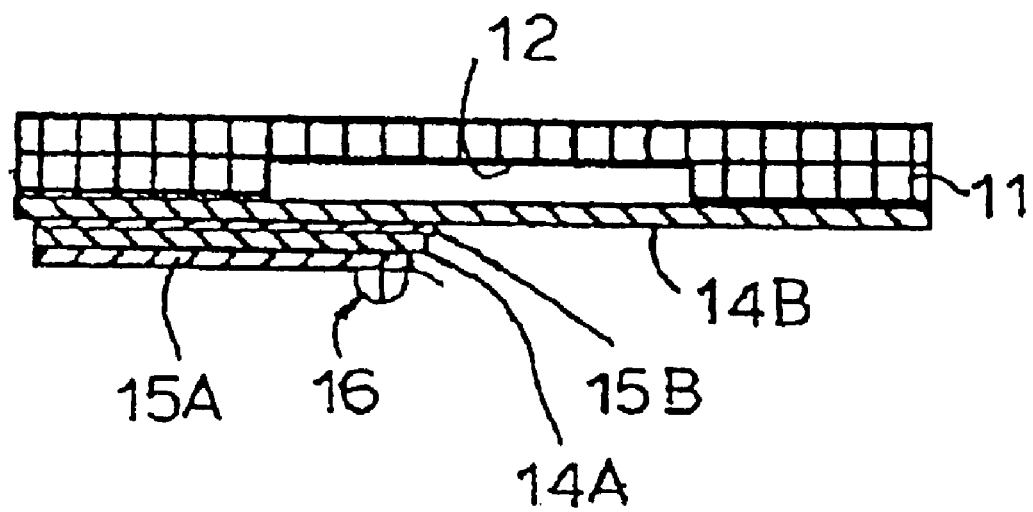

F I G. 17A
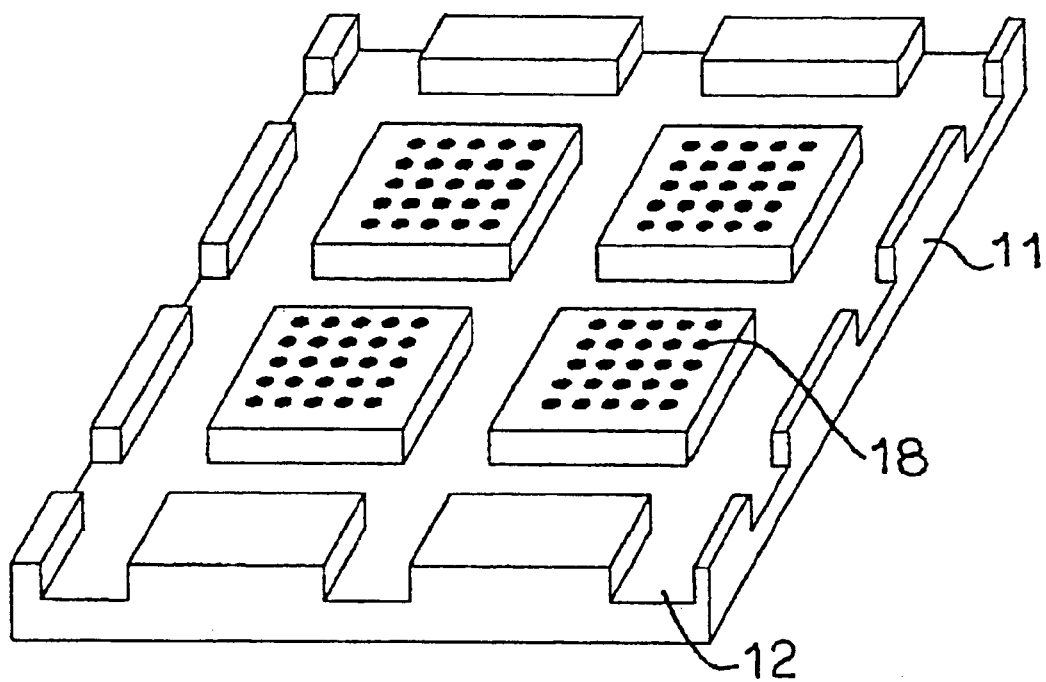

F I G. 1 7 B
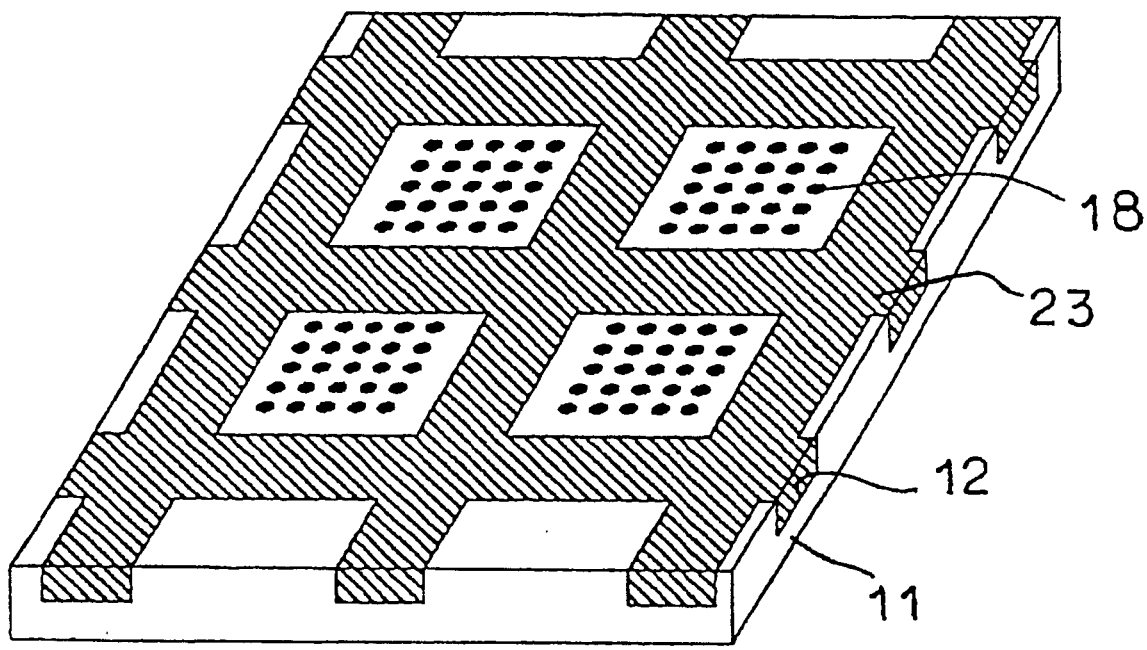

F I G. 1 7 D
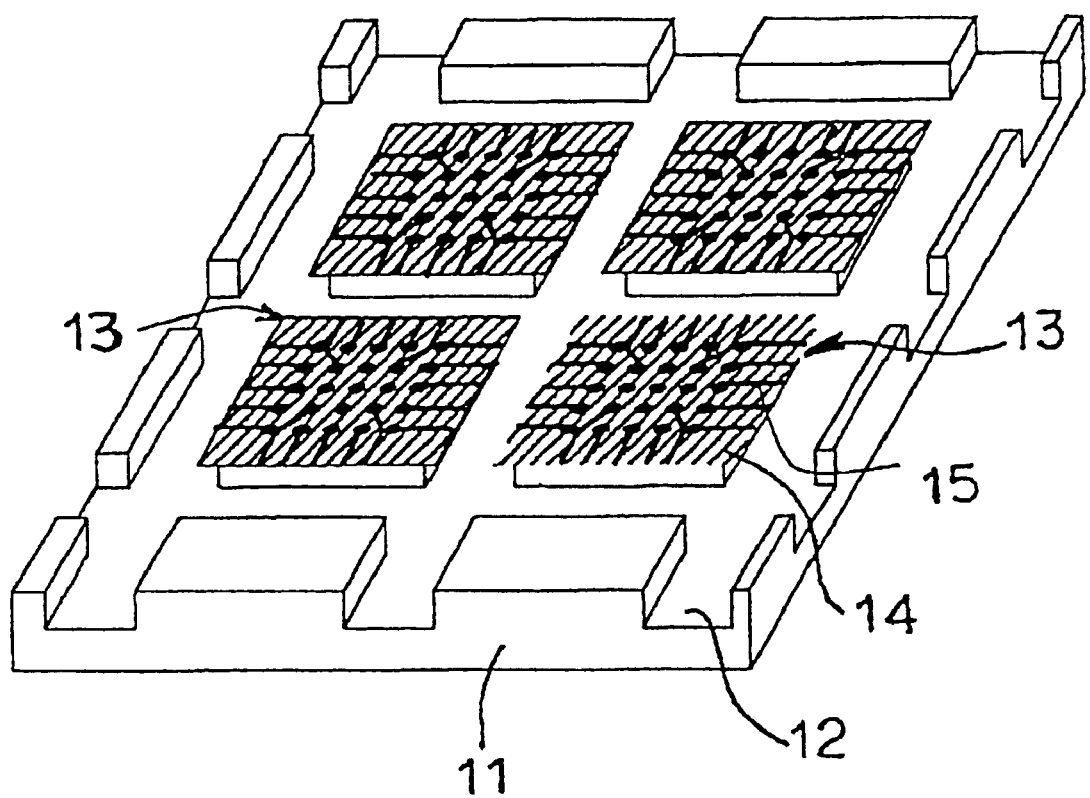

PROBE CARD WITH PLURAL PROBE TIPS ON A UNITARY FLEXIBLE TONGUE

BACKGROUND OF THE INVENTION

The present invention relates to a probe card and a method of forming the same.

The probe card has been used to electrically connect a tester to pads in a wafer chip for testing of a semiconductor device. A tungsten pin probe has been proposed and this probe has a structure as illustrated in FIG. 1. A plurality of tungsten pins 31 in the range of 50 $\mu m \phi$ to 100 $\mu m \phi$ are supported at their base portions by a supporter 32 whilst top portions of the tungsten pins 31 are held by a holder 33 so that the tops of the tungsten pins 31 are aligned to correspond to electrodes of a semiconductor device to be tested. The tops of the tungsten pins 31 contact the electrodes of the semiconductor device for characteristic test of the semiconductor device. As illustrated in FIG. 1, the tungsten pins 31 are narrowed in pitch toward the top portions thereof so that the pitch of the tungsten pins 31 at the top portions thereof is in the range of 0.5 mm to 5 mm, for which reason tungsten pins 31 cannot be used with the narrower electrode pitch of the semiconductor device for example in the scale of 100 micrometers. This tungsten pins 31 have a length in the range of 3 cm to 10 cm, for which reason high frequency performances over 100 MHz are deteriorated. Such probe is disclosed in the Japanese laid-open patent publication No. 6-118100.

In recent years, in place of the above probe, another probe has been proposed, which is a membrane probe as illustrated in FIG. 2. A plurality of probe interconnections 42 are formed on a surface of a film 41. The probe interconnections 42 are made of a conductive material such as copper whilst the film 41 is made of an insulative material such as polyimide. At the ends of the probe interconnections 42, bumps 43 are formed by a solder or a plating. Another surface of the film 41 is adhered via an elastomer 45 to a supporter 44. In this structure, it is possible to provide bumps on the surface of the film 41 to make electrical contact through the bumps to electrodes of the semiconductor device.

The conventional membrane probe has the following problems. If the plural bumps 43 and the electrodes of the semiconductor device do not have sufficiently high coplanarities, it seems that some bumps do not contact the electrodes of the semiconductor device. In order to prevent this problem, it is effective to provide flexibility to the interconnections to allow all the interconnections to contact the electrodes of the semiconductor device. This flexibility is provided only by the elastomer 45 formed on the other surface of the film 41, for which reason the amount of the deformation of the interconnections 42 are limited whereby the flexibility thereof is not responsive to the bowing of the semiconductor wafer.

Further, the probe interconnections 42 extend to a peripheral portion of the film 41 for connecting to an external device, for which purpose the probe interconnections have to have a sufficiently long length. This makes it difficult to achieve a substantial scale down of the probe. As a result, the probing is difficult for the semiconductor device having been formed over the wafer before a dicing process. The high frequency performance thereof is likely to be deteriorated.

In the above circumstances, it had been required to develop a novel probe card with improved reliability of contact to electrodes of the semiconductor device and that contacts a semiconductor device formed on a wafer, which is also improved in high frequency performance.

SUMMARY OF THE INVENTION

Accordingly, it is an object of the resent invention to provide a novel probe card which is free from any problems as described above.

It is a further object of the present invention to provide a novel probe card which has been improved in reliability of contacting to electrodes of a semiconductor device.

It is a still further object of the present invention to provide a novel probe card which is available to contact with a semiconductor device having been formed on a wafer.

It is yet a further object of the present invention to provide a novel probe card which is improved in high frequency performances.

It is a further more object of the present invention to provide a novel probe card which is improved in coplanarity.

It is moreover object of the present invention to provide a novel probe card reduced in interconnection space or area.

It is still more object of the present invention to provide a novel probe card which is improved in deformation stroke and flexibility.

It is yet more object of the present invention to provide a novel probe card which has multilevel interconnections for obtaining an impedance matching.

It is another object of the present invention to provide a novel method of forming a probe card which is free from any problems as described above.

It is further another object of the present invention to provide a novel method of forming a probe card which has been improved in reliability of contacting to electrodes of a semiconductor device.

It is a still another object of the present invention to provide a novel method of forming a probe card which is available to contact with a semiconductor device having been formed on a wafer.

It is yet a further another object of the present invention to provide a novel method of forming a probe card which is improved in high frequency performances.

It is a further more another object of the present invention to provide a novel method of forming a probe card which is improved in coplanarity.

It is moreover another object of the present invention to provide a novel method of forming a probe card reduced in interconnection space or area.

It is still more another object of the present invention to provide a novel method of forming a probe card which is improved in deformation stroke and flexibility.

It is yet more another object of the present invention to provide a novel method of forming a probe card which has multilevel interconnections for obtaining an impedance matching.

The above and other objects, features and advantages of the present invention will be apparent from the following descriptions.

The present invention provides a probe card comprising the following elements. An insulation film is provided which is flexible and extends on a first surface of a substrate. The insulation film has a first surface in contact with the first surface of the substrate, to form a space region which is defined between the first surface of the substrate and the first surface of the insulation film so as to allow part of the insulation film to move into the space. Probe patterns extend on a second surface of the insulation film so that the probe patterns.

The present invention provides a probe card comprising the following elements. A substrate has first and second surfaces. The first surface has a concave portion which separates opposite side regions of the first surface whilst the second surface is flat. An insulation film is provided which is flexible and extends on the first surface comprising the concave portion and the opposite side regions. The insulation film has a first surface in contact with the first surface of the substrate, to form a cavity which is defined between the concave portion of the substrate and the first surface of the insulation film to allow a center region of the insulation film to move into the space in a large movable stroke. A plurality of pairs of probe patterns are provided on a second surface of the insulation film and aligned in parallel to each other at a constant pitch in a vertical direction to a longitudinal direction of the probe patterns. The probe patterns making a pair are aligned on a line parallel to the longitudinal direction of the probe patterns. Top portions of the probe patterns making a pair face to each other but are spaced by an intermediate region of the insulation film. The intermediate region is positioned in the vicinity of a center of the cavity.

The present invention also provides a probe card comprising the following elements. A substrate has first and second surfaces. The first surface has a concave portion which separates opposite side regions of the first surface whilst the second surface is flat. An insulation film is flexible and extends on the fist surface of the substrate. The insulation film has a first surface in contact with the first surface of the substrate. The insulation film has a side edge portion which is positioned in the vicinity of a center of the concave portion of the substrate so that the side edge portion of the insulation film has a large movable stroke. A plurality of probe patterns are provided on a second surface of the insulation film and aligned in parallel to each other at a constant pitch in a vertical direction to a longitudinal direction of the probe patterns. The probe patterns have top portions positioned in the vicinity of a center of the concave portion of the substrate.

The present invention also provides a probe card comprising the following elements. A substrate has first and second flat surfaces. An insulation film is provided, which is flexible and comprises a first portion which is in contact with the first surface of the substrate, and a second portion which is distanced from the first surface of the substrate so that a distance between the second portion of the insulation film and the first surface of the substrate is gradually increased toward a side edge of the insulation film. The insulation film has a first surface and the first surface of the first portion of the insulation film is in contact with the first surface of the substrate. A plurality of probe patterns are provided on a second surface of the insulation film and aligned in parallel to each other at a constant pitch in a vertical direction to a longitudinal direction of the probe patterns.

BRIEF DESCRIPTIONS OF THE DRAWINGS

Preferred embodiments of the present invention will be described in detail with reference to the accompanying drawings.

FIG. 10 is a fragmentary cross sectional elevation view illustrative of a novel probe card as a still further modification of a first embodiment according to the present invention.

FIGS. 17A through 17 D are perspective views illustrative of a method of forming a novel probe card according to the present invention.

Figure 18:
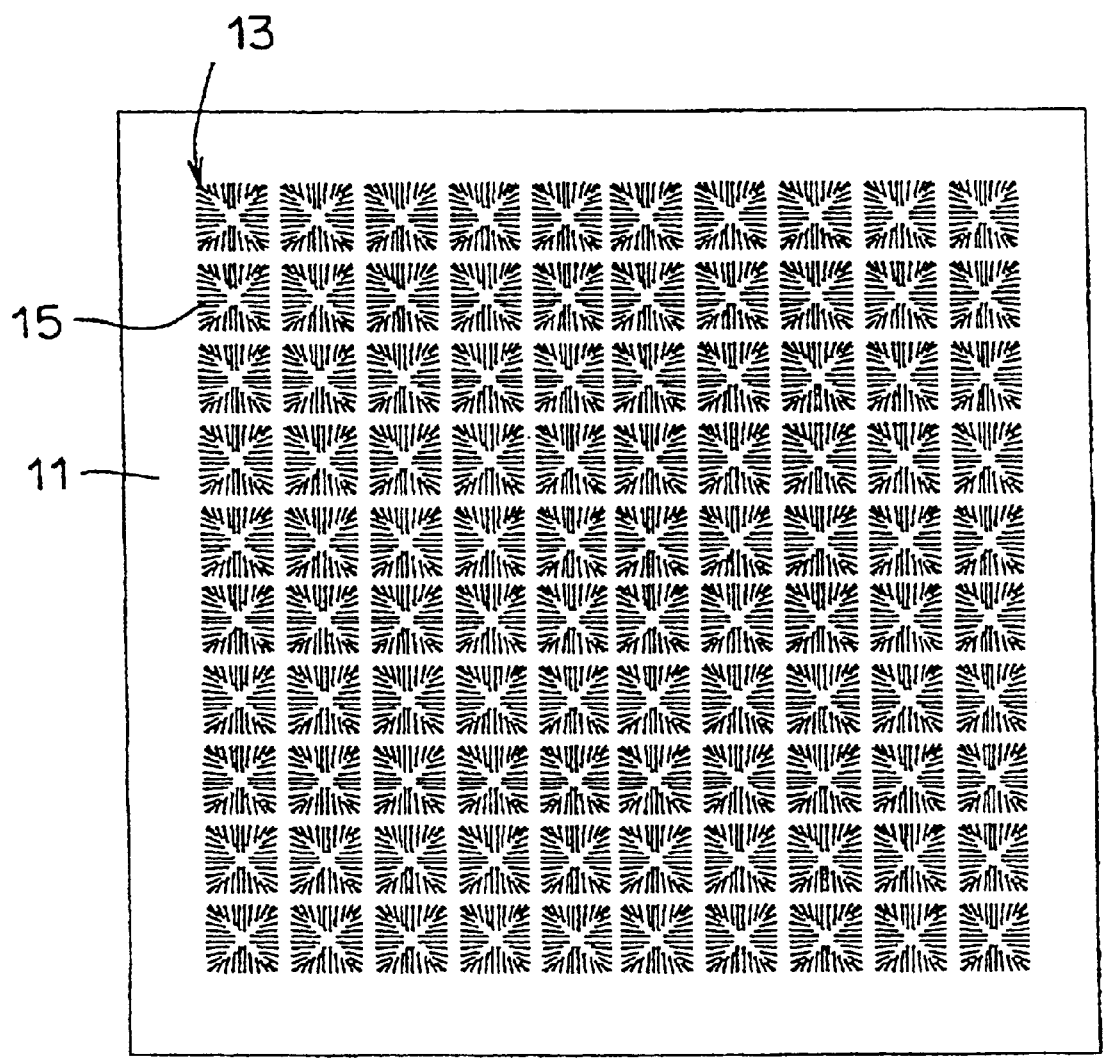

FIG. 18 is a plan view illustrative of probe patterns of a novel probe card in accordance with the present invention.

Figure 19:
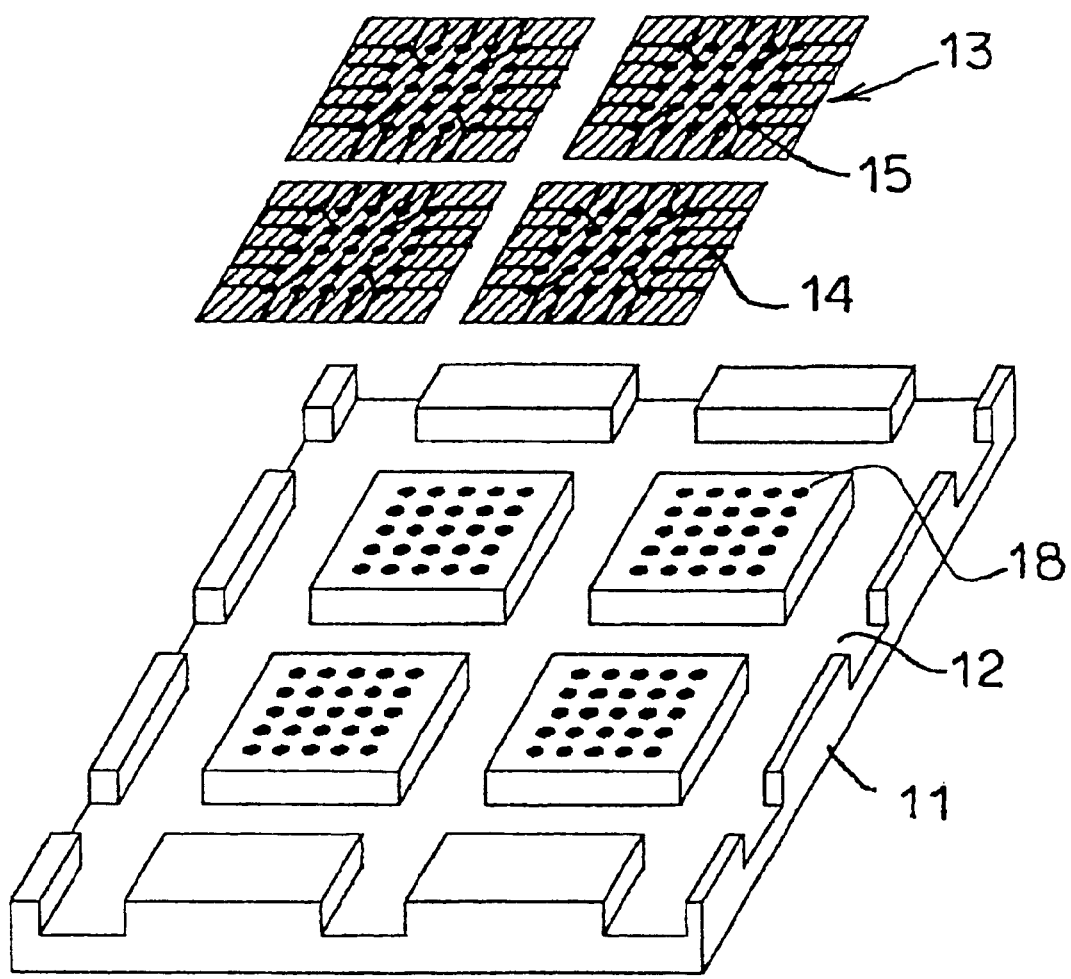

FIG. 19 is a perspective view illustrative of another method of forming a novel probe card according to the present invention.

Figure 20:
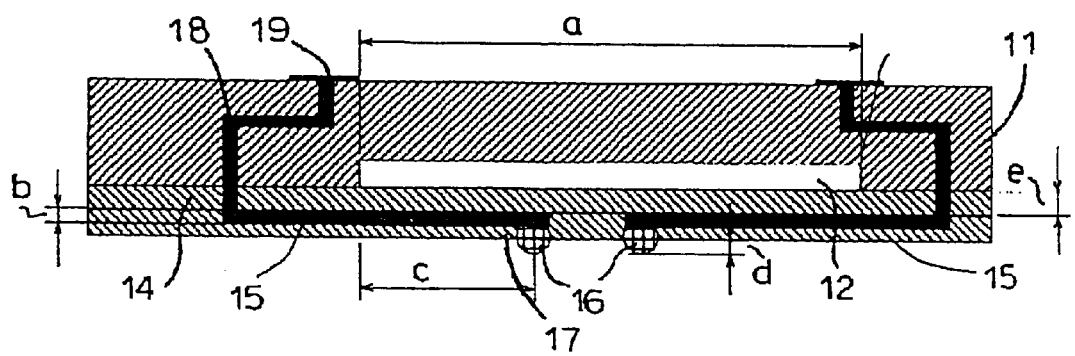

FIG. 20 is a fragmentary cross sectional elevation view illustrative of a novel probe card in a third embodiment according to the present invention.

Figure 21:
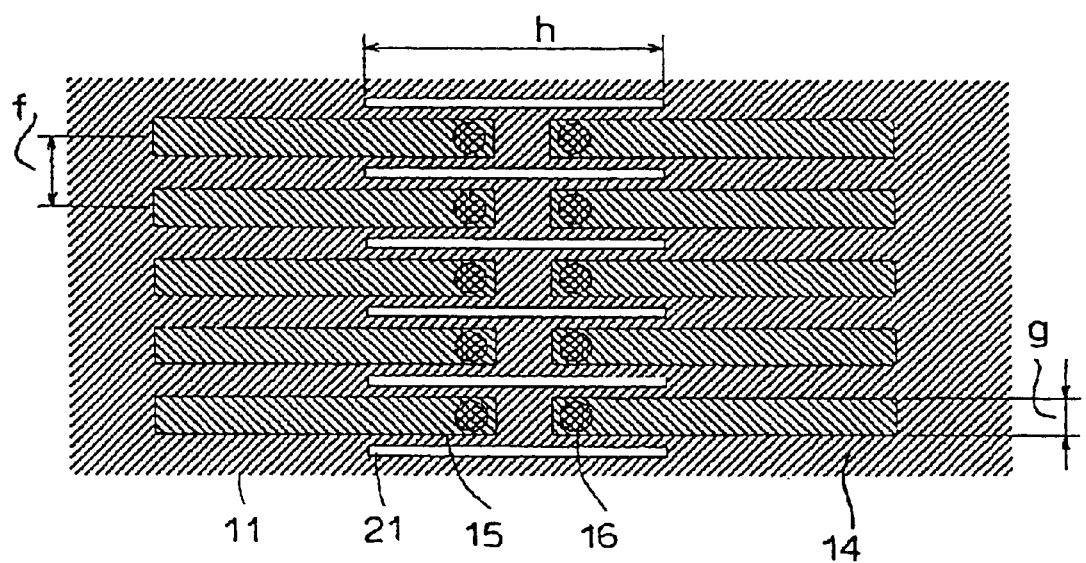

FIG. 21 is a fragmentary plan view illustrative of a novel probe card in a third embodiment according to the present invention.

DESCRIPTION OF THE PREFERRED EMBODIMENT

The present invention provides a probe card comprising the following elements. An insulation film is provided which is flexible and extends on a first surface of a substrate. The insulation film has a first surface in contact with the first surface of the substrate, to form a space region which is defined between the first surface of the substrate and the first surface of the insulation film so as to allow part of the insulation film to move into the space. Probe patterns extend on a second surface of the insulation film so that the probe patterns.

It is preferable that the first surface of the substrate has a concave portion which separates opposite side regions of the first surface thereby to form the space region defined between the concave portion and the first surface of the insulation film.

It is also preferable that the concave portion is rectangular-shaped.

It is also preferable that the concave portion is arch-shaped.

It is also preferable that the insulation film has a side edge portion which is positioned in the vicinity of a center of the concave portion of the substrate so that the side edge portion of the insulation film has a large movable stroke. It is also preferable that the probe patterns have top portions positioned in the vicinity of the side edge portion of the insulation film. It is also preferable that the top portions of the probe patterns are tapered. It is also preferable that bumps are provided at the top portions of the probe patterns. It is also preferable that the bumps are ball bumps. It is also preferable that the bumps are stud bumps. It is also preferable that the bumps are selective plating bumps.

It is also preferable that the probe patterns have a unchanged width.

It is also preferable to further provide conductive films selectively on the probe patterns to increase an elastic force of laminations of the insulation film, the probe patterns and the conductive films.

It is also preferable to further provide a plurality of slits in the insulation film at opposite sides of each of the probe patterns and extending in a longitudinal direction of the probe patterns so that each of the probe patterns laminated on the insulation film is independently movable from adjacent one of the probe patterns.

It is also preferable that the insulation film extends over the concave portion and the opposite side regions so that a center portion of the insulation film has a large movable stroke.

It is also preferable that the probe patterns are provided to make pairs so that the paired probe patterns extend on a line and the paired probe patterns have top portions facing to each other and separated from each other by a center region of the insulation film. It is also preferable that the top portions of the probe patterns are tapered. It is also preferable that bumps are provided at the top portions of the probe patterns. It is also preferable that the bumps are ball bumps. It is also preferable that the bumps are stud bumps. It is also preferable that the bumps are selective plating bumps.

It is also preferable that the probe patterns have a unchanged width.

It is also preferable to further provide conductive films selectively on the probe patterns to increase an elastic force of laminations of the insulation film, the probe patterns and the conductive films.

It is also preferable to further provide a plurality of slits in the insulation film at opposite sides of each of the probe patterns and extending in a longitudinal direction of the probe patterns over both the paired probe patterns so that each of the paired probe patterns laminated on the insulation film are independently movable from adjacent pairs of the probe patterns.

It is also preferable to further provide a slit in the intermediate region of the insulation film between the paired probe patterns and extending in a vertical direction to a longitudinal direction of the probe patterns so that one of the paired probe patterns laminated on the insulation film is independently movable from another of the paired probe patterns.

It is also preferable to further provide an additional insulation film to cover the probe patterns to increase an elastic force of laminations of the insulation film, the probe patterns and the additional insulation film.

It is also preferable that the insulation film comprises a first portion which is in contact with the first surface of the substrate, and a second portion which is distanced from the first surface of the substrate so that a distance between the second portion of the insulation film and the first surface of the substrate is gradually increased toward a side edge of the insulation film.

It is also preferable that the second portion of the insulation film is arched.

It is also preferable that the insulation film is bent at a boundary between the first and second portions so that a surface of the second portion of the insulation film is tilted from the first surface of the substrate.

It is also preferable that the probe patterns have top portions positioned in the vicinity of the side edge portion of the insulation film.

It is also preferable that the top portions of the probe patterns are tapered.

It is also preferable that the probe patterns have a unchanged width.

It is also preferable to further provide conductive films selectively on the probe patterns to increase an elastic force of laminations of the insulation film, the probe patterns and the conductive films.

It is also preferable to further provide a plurality of slits formed in the insulation film at opposite sides of each of the probe patterns and extending in a longitudinal direction of the probe patterns so that each of the probe patterns laminated on the insulation film is independently movable from adjacent one of the probe patterns.

It is also preferable to further provide an additional insulation film provided to cover the probe patterns to increase an elastic force of laminations of the insulation film, the probe patterns and the additional insulation film.

The present invention provides a probe card comprising the following elements. A substrate has first and second surfaces. The first surface has a concave portion which separates opposite side regions of the first surface whilst the second surface is flat. An insulation film is provided which is flexible and extends on the first surface comprising the concave portion and the opposite side regions. The insulation film has a first surface in contact with the first surface of the substrate, to form a cavity which is defined between the concave portion of the substrate and the first surface of the insulation film to allow a center region of the insulation film to move into the space in a large movable stroke. A plurality of pairs of probe patterns are provided on a second surface of the insulation film and aligned in parallel to each other at a constant pitch in a vertical direction to a longitudinal direction of the probe patterns. The probe patterns making a pair are aligned on a line parallel to the longitudinal direction of the probe patterns. Top portions of the probe patterns making a pair face to each other but are spaced by an intermediate region of the insulation film. The intermediate region is positioned in the vicinity of a center of the cavity.

It is preferable that the concave portion is rectangular-shaped.

It is also preferable that the concave portion is arch-shaped.

It is also preferable that the probe patterns are symmetrical to the intermediate region of the insulation film.

It is also preferable that the top portions of the probe patterns are tapered.

It is also preferable that bumps are provided at the top portions of the probe patterns. It is also preferable that the bumps are ball bumps. It is also preferable that the bumps are stud bumps. It is also preferable that the bumps are selective plating bumps.

It is also preferable that the probe patterns have a unchanged width.

It is also preferable to further provide conductive films selectively on the probe patterns to increase an elastic force of laminations of the insulation film, the probe patterns and the conductive films.

It is also preferable to further provide a plurality of slits in the insulation film at opposite sides of each of the probe patterns and extending in a longitudinal direction of the probe patterns so that each of the probe patterns laminated on the insulation film is independently movable from adjacent one of the probe patterns.

It is also preferable to further provide a slit in the intermediate region of the insulation film between the paired probe patterns and extending in the vertical direction to the longitudinal direction of the probe patterns so that one of the paired probe patterns laminated on the insulation film is independently movable from another of the paired probe patterns.

It is also preferable to further provide an additional insulation film to cover the probe patterns to increase an elastic force of laminations of the insulation film, the probe patterns and the additional insulation film.

The present invention also provides a probe card comprising the following elements. A substrate has first and second surfaces. The first surface has a concave portion which separates opposite side regions of the first surface whilst the second surface is flat. An insulation film is flexible and extends on the fist surface of the substrate. The insulation film has a first surface in contact with the first surface of the substrate. The insulation film has a side edge portion which is positioned in the vicinity of a center of the concave portion of the substrate so that the side edge portion of the insulation film has a large movable stroke. A plurality of probe patterns are provided on a second surface of the insulation film and aligned in parallel to each other at a constant pitch in ;i vertical direction to a longitudinal direction of the probe patterns. The probe patterns have top portions positioned in the vicinity of a center of the concave portion of the substrate.

It is also preferable that the concave portion is rectangular-shaped.

It is also preferable that the concave portion is arch-shaped.

It is also preferable that the top portions of the probe patterns are tapered.

It is also preferable that bumps are provided at the top portions of the probe patterns. It is also preferable that the bumps are ball bumps. It is also preferable that the bumps are stud bumps. It is also preferable that the bumps are selective plating bumps.

It is also preferable that the probe patterns have a unchanged width.

It is also preferable to further provide conductive films selectively provided on the probe patterns to increase an elastic force of laminations of the insulation film, the probe patterns and the conductive films.

It is also preferable to further provide a plurality of slits formed in the insulation film at opposite sides of each of the probe patterns and extending in a longitudinal direction of the probe patterns so that each of the probe patterns laminated on the insulation film is independently movable from adjacent one of the probe patterns.

It is also preferable to further provide comprising an additional insulation film provided to cover the probe patterns to increase an elastic force of laminations of the insulation film, the probe patterns and the additional insulation film.

The present invention also provides a probe card comprising the following elements. A substrate has first and second flat surfaces. An insulation film is provided, which is flexible and comprises a first portion which is in contact with the first surface of the substrate, and a second portion which is distanced from the first surface of the substrate so that a distance between the second portion of the insulation film and the first surface of the substrate is gradually increased toward a side edge of the insulation film. The insulation film has a first surface and the first surface of the first portion of the insulation film is in contact with the first surface of the substrate. A plurality of probe patterns are provided on a second surface of the insulation film and aligned in parallel to each other at a constant pitch in a vertical direction to a longitudinal direction of the probe patterns.

It is preferable that the second portion of the insulation film is arched.

It is also preferable that the insulation film is bent at a boundary between the first and second portions so that a surface of the second portion of the insulation film is tilted from the first surface of the substrate.

It is also preferable that the probe patterns have top portions positioned in the vicinity of the side edge portion of the insulation film. It is also preferable that the top portions of the probe patterns are tapered. It is also preferable that the probe patterns have a unchanged width.

It is also preferable to further provide conductive films selectively on the probe patterns to increase an elastic force of laminations of the insulation film, the probe patterns and the conductive films.

It is also preferable to further provide a plurality of slits in the insulation film at opposite sides of each of the probe patterns and extending in a longitudinal direction of the probe patterns so that each of the probe patterns laminated on the insulation film is independently movable from adjacent one of the probe patterns.

It is also preferable to further provide an additional insulation film to cover the probe patterns to increase an elastic force of laminations of the insulation film, the probe patterns and the additional insulation film.

The present invention also provides a probe card comprising the following elements. A substrate has first and second surfaces. The first surface has a concave portion which separates opposite side regions of the first surface whilst the second surface is flat. An insulation film is provided which is flexible and extends on the first surface comprising the concave portion and the opposite side regions. The insulation film has a first surface in contact with the first surface of the substrate, to form a cavity which is defined between the concave portion of the substrate and the first surface of the insulation film to allow a center region of the insulation film to move into the space in a large movable stroke. At least a contact hole is formed in the substrate and the insulation film. A plurality of pairs of probe patterns are provided on a second surface of the insulation film and aligned in parallel to each other at a constant pitch in a vertical direction to a longitudinal direction of the probe patterns. The probe patterns making a pair are aligned on a line parallel to the longitudinal direction of the probe patterns. Top portions of the probe patterns making a pair face to each other but are spaced by an intermediate region of the insulation film. The intermediate region are positioned in the vicinity of a center of the cavity. At least an interconnection is provided on the second surface of the substrate and the interconnection is connected through the contact hole to at least one of the probe patterns. Bumps are provided on the top portions of the probe patterns.

It is preferable that the probe patterns are symmetrical to the intermediate region of the insulation film.

It is also preferable that the top portions of the probe patterns are tapered.

It is also preferable that the bumps are ball bumps.

It is also preferable that the bumps are stud bumps.

It is also preferable that the bumps are selective plating bumps.

It is also preferable that the probe patterns have a unchanged width.

It is also preferable to further provide conductive films selectively on the probe patterns to increase an elastic force of laminations of the insulation film, the probe patterns and the conductive films.

It is also preferable to further provide a plurality of slits in the insulation film at opposite sides of each of the probe patterns and extending in a longitudinal direction of the probe patterns so that each of the probe patterns laminated on the insulation film is independently movable from adjacent one of the probe patterns.

It is also preferable to further provide a slit in the intermediate region of the insulation film between the paired probe patterns and extending in the vertical direction to the longitudinal direction of the probe patterns so that one of the paired probe patterns laminated on the insulation film is independently movable from another of the paired probe patterns.

It is also preferable to further provide an additional insulation film to cover the probe patterns to increase an elastic force of laminations of the insulation film, the probe patterns and the additional insulation film.

The present invention also provides a probe card comprising the following elements. A substrate has first and second surfaces. The first surface has a concave portion which separates opposite side regions of the first surface whilst the second surface is flat. An insulation film is provided which is flexible and extends on the fist surface of the substrate. The insulation film has a first surface in contact with the first surface of the substrate. The insulation film has a side edge portion which is positioned in the vicinity of a center of the concave portion of the substrate so that the side edge portion of the insulation film has a large movable stroke. At least a contact hole is formed in the substrate and the insulation film. A plurality of probe patterns are provided on a second surface of the insulation film and aligned in parallel to each other at a constant pitch in a vertical direction to a longitudinal direction of the probe patterns. The probe patterns have top portions positioned in the vicinity of a center of the concave portion of the substrate. At least an interconnection is provided on the second surface of the substrate and the interconnection is connected through the contact hole to at least one of the probe patterns. Bumps are provided on the top portions of the probe patterns.

It is also preferable that the top portions of the probe patterns are tapered.

It is also preferable that the bumps are ball bumps.

It is also preferable that the bumps are stud bumps.

It is also preferable that the bumps are selective plating bumps.

It is also preferable that the probe patterns have a unchanged width.

It is also preferable to further provide conductive films selectively on the probe patterns to increase an elastic force of laminations of the insulation film, the probe patterns and the conductive films.

It is also preferable to further provide a plurality of slits in the insulation film at opposite sides of each of the probe patterns and extending in a longitudinal direction of the probe patterns so that each of the probe patterns laminated on the insulation film is independently movable from adjacent one of the probe patterns.

It is also preferable to further provide an additional insulation film to cover the probe patterns to increase an elastic force of laminations of the insulation film, the probe patterns and the additional insulation film.

The present invention provides a probe card comprising the following elements. A substrate has first and second flat surfaces. An insulation film is provided which is flexible and comprises a first portion which is in contact with the first surface of the substrate and a second portion which is distanced from the first surface of the substrate so that a distance between the second portion of the insulation film and the first surface of the substrate is gradually increased toward a side edge of the insulation film. The insulation film has a first surface and the first surface of the first portion of the insulation film is in contact with the first surface of the substrate. At least a contact hole is formed in the substrate and the insulation film. A plurality of probe patterns are provided on a second surface of the insulation film and aligned in parallel to each other at a constant pitch in a vertical direction to a longitudinal direction of the probe patterns. At least an interconnection is provided on the second surface of the substrate and the interconnection is connected through the contact hole to at least one of the probe patterns. Bumps are provided on the top portions of the probe patterns.

It is also preferable that the second portion of the insulation film is arched.

It is also preferable that the insulation film is bent at a boundary between the first and second portions so that a surface of the second portion of the insulation film is tilted from the first surface of the substrate.

It is also preferable that the probe patterns have top portions positioned in the vicinity of the side edge portion of the insulation film.

It is also preferable that the top portions of the probe patterns are tapered.

It is also preferable that the probe patterns have a unchanged width.

It is also preferable to further provide conductive films selectively on the probe patterns to increase an elastic force of laminations of the insulation film, the probe patterns and the conductive films.

It is also preferable to further provide a plurality of slits in the insulation film at opposite sides of each of the probe patterns and extending in a longitudinal direction of the probe patterns so that each of the probe patterns laminated on the insulation film is independently movable from adjacent one of the probe patterns.

It is also preferable to further provide an additional insulation film to cover the probe patterns to increase an elastic force of laminations of the insulation film, the probe patterns and the additional insulation film.

The present invention also provides a method of forming a probe card comprising the following steps. Grooves are formed in a substrate to define islands of the substrate separated from each other by the grooves. The grooves are filled with a filling material. An upper surface of the filling material is leveled to top surfaces of the islands of the substrate. A photo-sensitive resin film is applied on the leveled upper surfaces of the filling material and the islands of the substrate. The photo-sensitive resin film is patterned by photo-lithography to form insulation films extending over the islands and the filling material but only on peripheral regions of the islands. Conductive probe patterns are provided on the insulation films by a lift-off method. Removal is made of the filling material.

The present invention provides a method of forming a probe card comprising the step of adhering insulation films, on which conductive probe patterns having been formed, onto islands defined by grooves having been formed in a substrate, wherein the insulation films extend over the islands and peripheral regions of the islands.

The effects of the above described present invention will be apparent from the following descriptions.

A first embodiment according to the present invention will be described in detail with reference to the accompanying drawings, wherein a novel probe card is provided.

Figure 1:
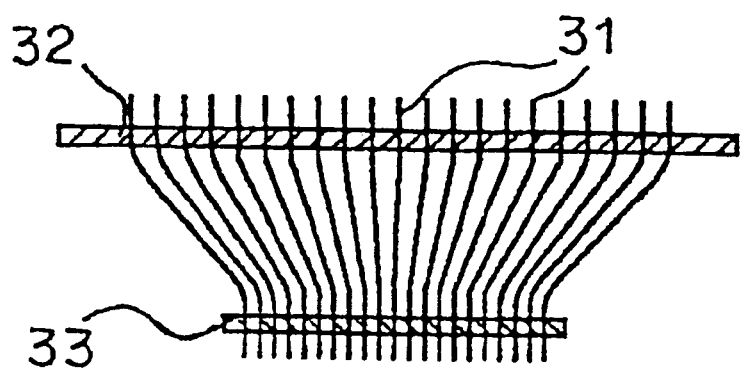
FIG. 1 is a view illustrative of the conventional probe.
Figure 2:
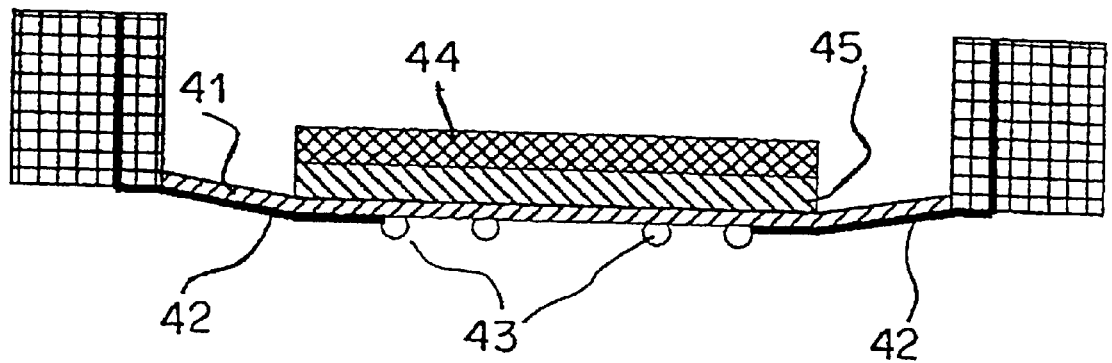
FIG. 2 is a cross sectional elevation view illustrative of the other conventional probe.
Figure 3:
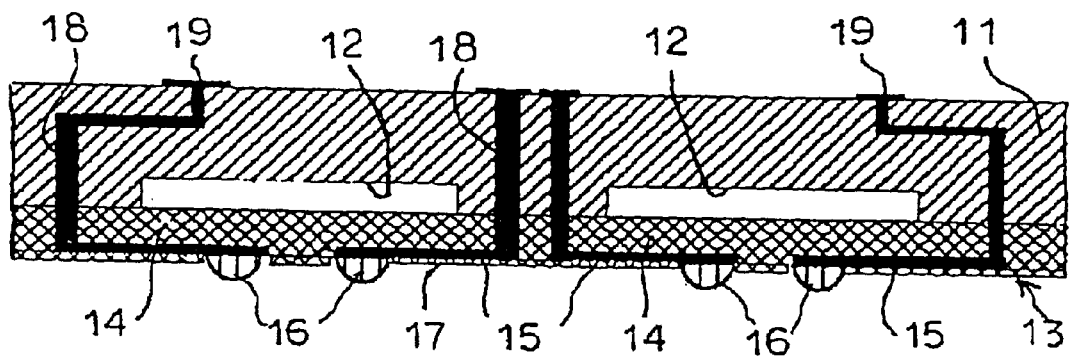
FIG. 3 is a fragmentary cross sectional elevation view illustrative of a novel probe card in a first embodiment according to the present invention.
Figure 4:
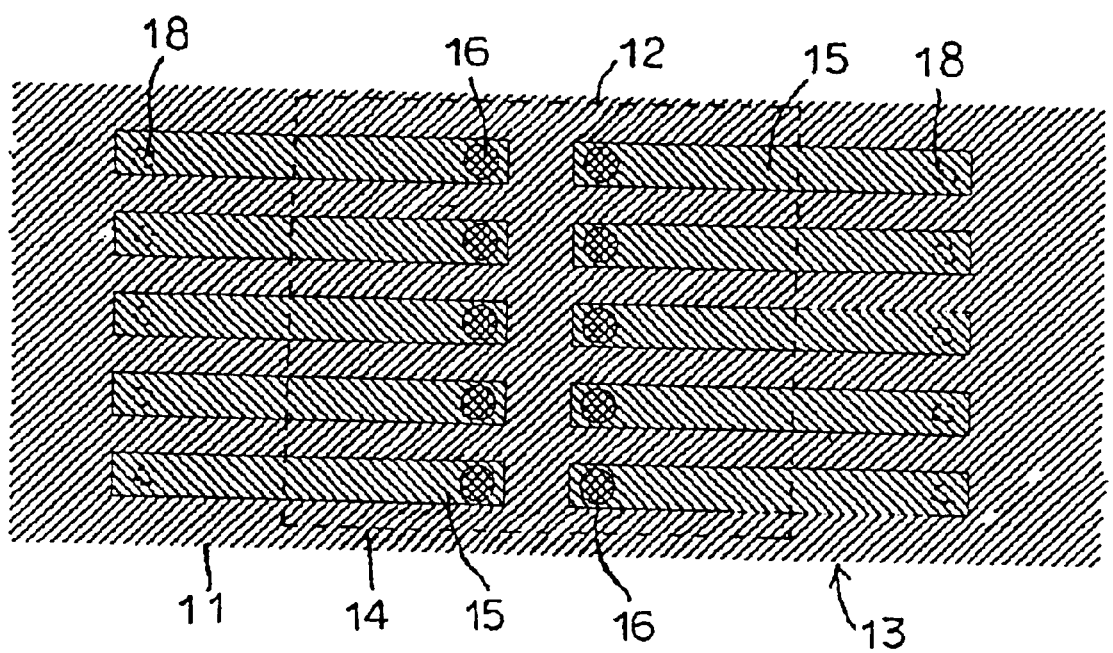
FIG. 4 is a fragmentary plane view illustrative of a novel probe card in a first embodiment according to the present invention.

With reference to FIGS. 3 and 4, a plurality of probes are provided to form a probe card. A substrate 11 is used, which is made of ceramics such as alumina, aluminum nitride, glass and glass ceramics or resins such as glass epoxy resin. The substrate 11 has a bottom surface in which concave portions 12 are formed. The concave portions 12 have a predetermined depth. On the bottom surface of the substrate 11, a probe film 13 is adhered. The probe film 13 comprises laminations of a resin film 14 and a conductive film 15. The resin film 14 is formed on the bottom surface of the substrate 11 and the conductive film 15 is laminated on the resin film 14. The conductive film 15 is so formed as a probe pattern. The resin film 14 may be made of polyimide, benzocyclobutene or epoxy resins. The probe pattern conductive film 15 is made of a metal such as copper or nickel.

The probe pattern conductive film 15 is so patterned to form plural slender lines which extend onto a bottom surface of the resin film 14. The top portions of the slender lines of the probe pattern conductive film 15 extends on the bottom surface of the resin film 14 positioned under the concave portions 12. At the top portions of the probe patterns 15, conductive bumps 16 are formed by solder or metal plating. An insulation resin film 17 is formed to coat the surface of the probe pattern 15 except on the bumps 16. The substrate 11 has through holes 18 through which the robe pattern 15 extends up to a top surface of the substrate 11 so that the end portions of the probe pattern 5 are shown on the top surface of the substrate 11. Interconnection patterns 19 are provided in contact with the end portions of the probe pattern 5 and over the top surface of the substrate 11 so that the interconnection patterns 19 are electrically connected to the probe pattern 15. The interconnection patterns 19 are further electrically connected to any external measuring apparatus.

The above novel probe card has the concave portion formed in the bottom surface of the substrate 11 so that cavities are formed between the substrate 11 and the insulation resin film 14. The cavities allow the insulation resin film 14 to be deformed to have a bowing so that the insulation resin film 14 is pushed into the cavities. This means that the cavities provide flexibility to the insulation resin film 14. When the bumps 15 are made into contact with electrodes of a semiconductor device to be tested by the probe card, the bumps 15 are pushed toward the cavities whereby the insulation resin film 14 ire deformed or bent into the cavities When the insulation resin film 14 are deformed or bent, the insulation resin film 14 has an increased elastic force. This elastic force pushes the bumps 16 toward the electrodes of the semiconductor device so that the bumps are secured onto the electrodes of the semiconductor device whereby a secure electrical connection can be obtained. The cavities allows increased deformation of the insulation resin film 14 whereby deformation stroke in the thickness direction of the substrate is increased. This increased stroke of the deformation of the insulation resin film 14 allows, if the wafer has a bowing, all of the bumps to be securely made into contact with the electrodes of the semiconductor device.

The concave portions formed in the bottom surface of the substrate 11 may be rectangular-shaped to form rectangular-shaped cavities between the substrate 11 and the insulation resin film 14 as well illustrated in FIG. 3.

Figure 5:
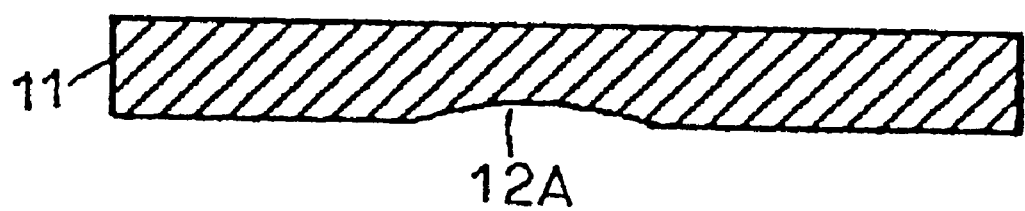
FIG. 5 is a fragmentary cross sectional elevation view illustrative of a substrate as a modification of a first embodiment according to the present invention.

In place of the rectangular-shaped cavities, it is possible to form an arch-shaped concave portions 12a in the bottom surface of the substrate 11 to form arch-shaped cavities between the substrate 11 and the insulation resin film 14 as illustrated in FIG. 5.

The shape in plan view of the cavities or the concave portions 12 may be rectangle, circle or ellipse or other various shapes, provided that the top portions of the probe pattern 5 and the bumps are positioned under the cavities or the concave portions 12 so as to allow the insulation resin film 14 to be deformed and pushed into the cavities when the bumps 16 are pushed toward the cavities.

The depth of the concave portions 12 or the cavities may be adopted to obtain the required large deformation stroke of the top portions of the probe pattern and the bumps 16.

Figure 6:
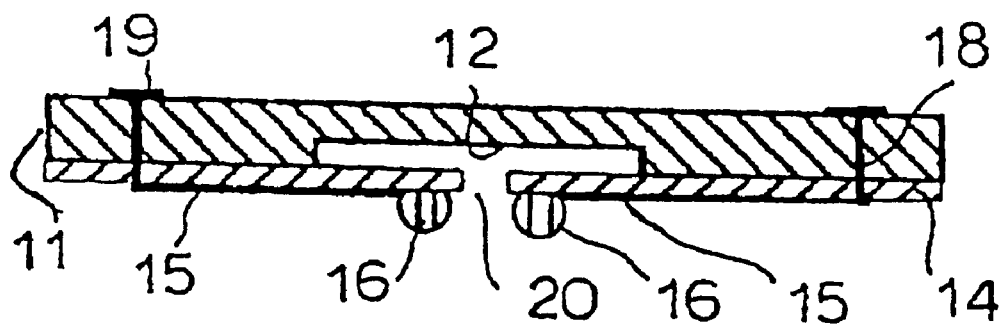
FIG. 6 is a fragmentary cross sectional elevation view illustrative of a novel probe card as a modification of a first embodiment according to the present invention.

As a further modification of the cavities, it is possible to form a probe card as illustrated in FIG. 6. A substrate 11 has a bottom surface in which a concave portion 12 is formed. An insulation resin film 14 is provided which extends on the bottom surface of the substrate so that the insulation resin film 14 extends under the concave portion 12. A probe pattern 15 is formed which extends on a bottom surface of the insulation resin film 14. Top portions of the probe pattern extend under the insulation resin film 14 underlying the concave portion 12 of the substrate 11. Through holes 18 are formed in the insulation resin film 14 and the substrate 11 so that the end portions of the probe pattern 15 extend through the through holes 18 and are shown on the top surface of the substrate 11. Interconnection patterns 19 are formed in contact with the end portions of the probe pattern 15 and over the top surface of the substrate 11. At the top portions of the probe pattern 15, bumps 16 are formed. The insulation resin film 14 has a slit 20 which extends along a center line between the bumps 16. The cavity is defined by both the concave portion 12 of the substrate 11 and the insulation resin film 14 extending under the concave portion 12. The cavity is, however, spatially connected via the slit 20 to the external space. The slit 20 has a width defined by edges of the insulation resin film 14. The edges of the insulation film 14 are regarded to form the free ends. This means that the formations of the slit 20 increase the flexibility of the insulation resin film 14 particularly at the edge portions defining the slit 20. The increased flexibility of the insulation resin film 14 at the edge portions defining the slit 20 facilitates deformation of the insulation resin film 14 and also increases the deformation stroke of the edge portions of the insulation resin film 14. This means that the deformation stroke of the bumps 16 is also increased. The slit 20 also ensures that the insulation resin film 14 extending over the cavity has an sufficiently high elastic force for allowing the bumps to be securely made into contact with the electrodes of the semiconductor device even if the chip has a large bowing.

Figure 7:
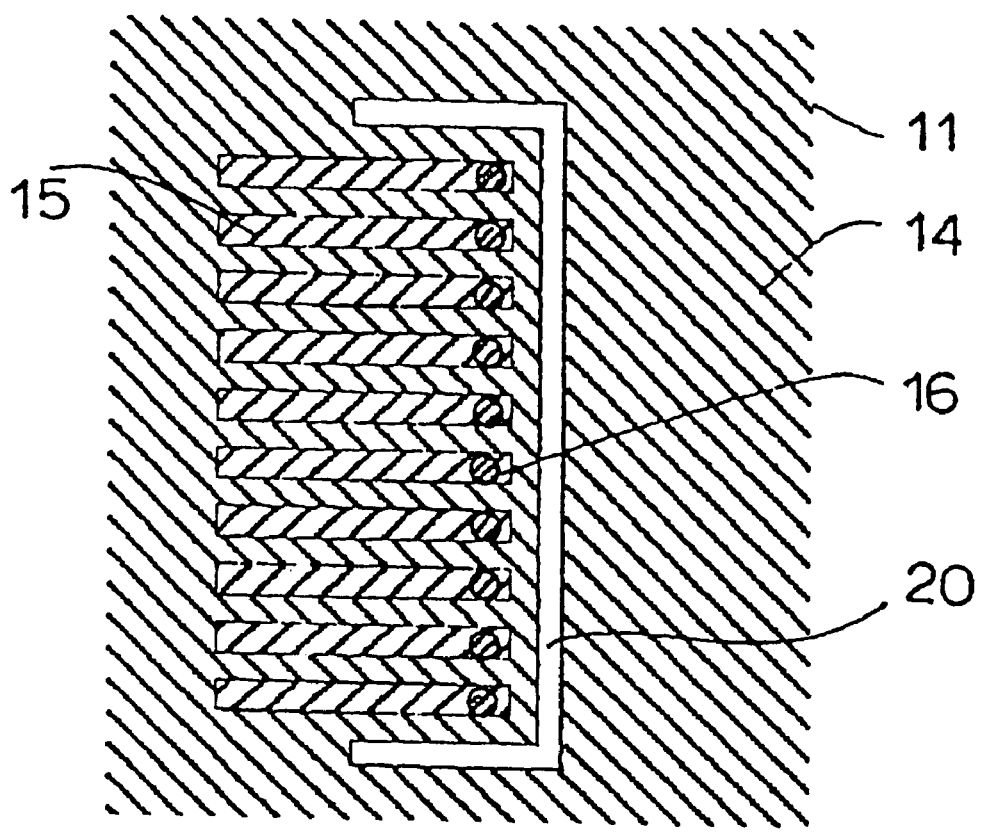
FIG. 7 is a fragmentary plane view illustrative of a novel probe card as a modification of a first embodiment according to the present invention.

The slit 20 may be defined to form a single slender line in plan view as illustrated in FIG. 7. In this case, the top portions of the probe pattern 14 are deformed together.

Figure 8:
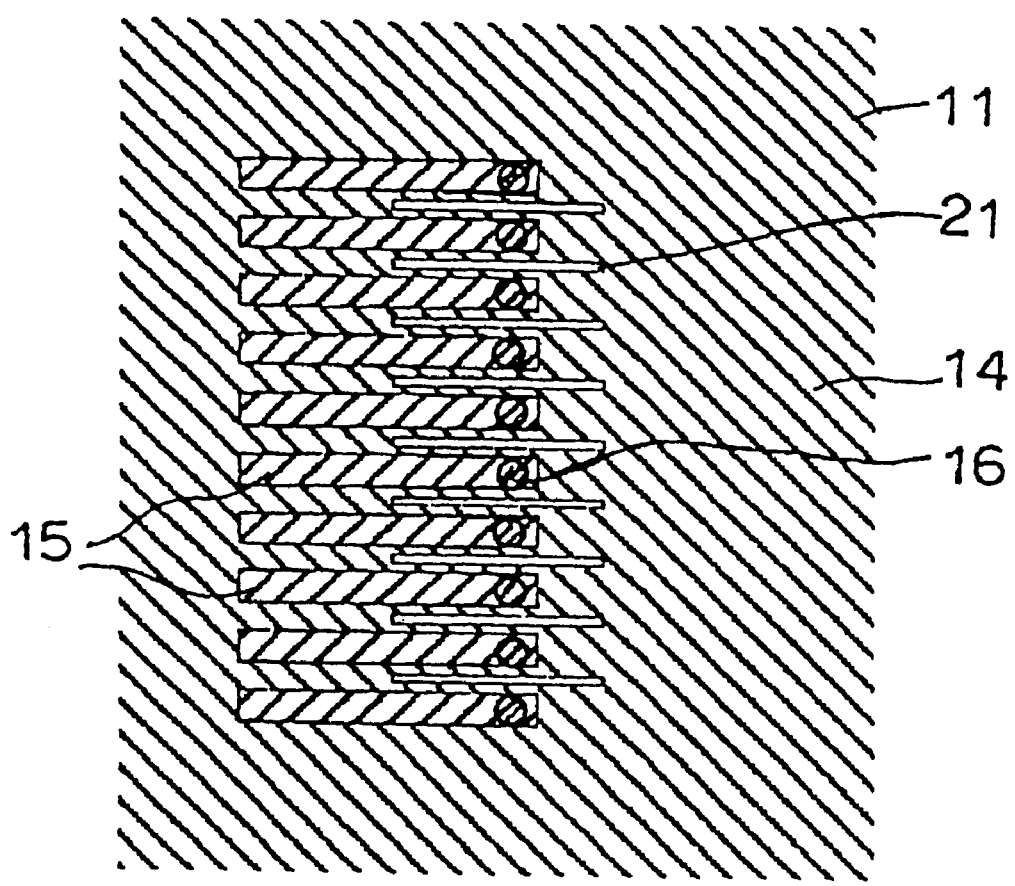
FIG. 8 is a plan cross sectional elevation view illustrative of a novel probe card as a further modification of a first embodiment according to the present invention.

Alternatively, it is also available that slits 21 may be defined in the insulation resin film 14 in plan view as illustrated in FIG. 8. Each the slits 21 extends in the insulation resin film 14 between the adjacent two top portions of the probe pattern 14 so as to allow the top portions of the probe pattern 14 to be deformed separately from each other. Those slits 21 increase the individual defamation stroke of each the top portions of the probe pattern 15 and each the bumps 16 thereby allowing the individual top portions of the probe pattern and the bumps 16 to be made into securely contact with the corresponding electrodes of the semiconductor device even if the electrodes of the semiconductor device has a deteriorated co-coplanarity.

Figure 9:
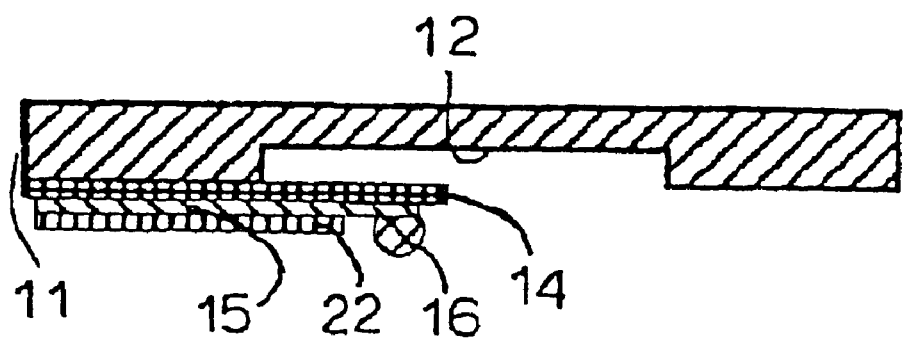
FIG. 9 is a fragmentary cross sectional elevation view illustrative of a novel probe card as a further modification of a first embodiment according to the present invention.

A further more modification of the probe card may be made as illustrated in FIG. 9, wherein a conductive film 22 is further laminated on a surface of a probe pattern so as to increase an elastic force of the probe pattern 15. The substrate 11 has a bottom surface in which the concave portion 12 is formed. An insulation resin film 14 is provided which extends on the bottom surface of the substrate 11 so that the insulation resin film 14 extends under the concave portion 12. A probe pattern 15 of a conductive film is provided which extends on a bottom surface of the insulation resin film 14. The probe pattern 15 has tops at which bumps 16 are provided. In this further modification, the conductive film 22 is further provided which extends on a bottom surface of the probe pattern except on the bumps 14. The conductive film 22 has a flexibility and an elastic force which increase in the elastic force of the card probe in cooperation with the elastic force of the insulation resin film 14. The insulation resin film 14 has a free end which is positioned at an intermediate position of the concave portion whereby the probe pattern has a large deformation stroke. Consequently, the probe card has a large elastic force and a large deformation stroke thereby allowing the bumps to be made into securely contact with the electrodes of the semiconductor device even if the chip has a bowing or the electrodes have deteriorated coplanarity.

A moreover modification of the probe card may be made as illustrated in FIG. 10. A substrate 12 has a bottom surface in which a concave portion 12 is formed. An insulation resin film 14B is provided which extends on the bottom surface of the substrate 11. A conductive film 15B is provided which extends on a bottom surface of the insulation resin film 14B but only in a left half region of the insulation resin film 14B. An insulation resin film 14A is further provided which extends on a bottom surface of the conductive film 15B. A probe pattern 15A is further provided which extends over the insulation resin film 14A. At the top portion of the probe pattern 15A, bump 16 are provided. The conductive film 15B forms an interconnection. A cavity is defined by the concave portion 12 of the substrate 11 and the insulation resin film 14B. The cavity allows the insulation resin film 14B to be pushed into the cavity thereby providing flexibility to the insulation resin film 14B. This increases the flexibility of the laminations of the conductive films 15A and 15B and the insulation resin film 14A, resulting in the defamation stroke of the bumps 16 and the free end of the laminations of the conductive films 15A and 15B and the insulation resin film 14A. The laminations of the conductive films 15A and 15B and the insulation resin film 14A increase the elastic force.

Figure 11:
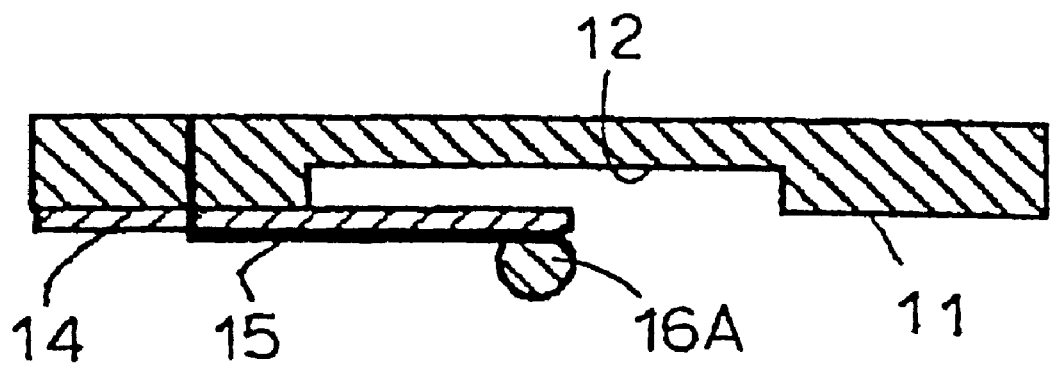
FIG. 11 is a fragmentary cross sectional elevation view illustrative of a novel probe card as yet a further modification of a first embodiment according to the present invention.

A still further modification of the probe card may be made as illustrated in FIG. 11. A substrate 11 has a bottom surface in which a concave portion 12 is formed. An insulation resin film 14 is provided which extends on a bottom surface of the substrate 11 so that the insulation resin film 14 extends under the concave portion 12 and the top portion of the insulation resin film 14 is positioned at the center of the concave portion 12. A probe pattern 15 comprising a conductive film is provided which extends on a bottom surface of the insulation resin film 14. A through hole is formed through both the substrate 11 and the insulation resin film 14 so that the end portion of the conductive film as the probe pattern 15 extends through the through hole and is shown on the top surface of the substrate 11. Bumps 16A are provided on the top portions of the probe pattern 15. The bumps 16A are spherically shaped by use of a surface tension of a conductive material or a solder. The top portion of the insulation resin film 14 comprises a free end positioned under the concave portion 12 of the substrate 11 thereby allowing the top portions of the probe pattern 15 to be pushed into the concave portion 12. The concave portion 12 provides an increased flexibility to laminations of the insulation resin film 14 and the probe pattern 15. The concave portion 12 also increases the defamation stroke of the top portions of the insulation resin film and the probe pattern 15. The concave portion 12 allows the bumps 16 A to be made into securely contact with the electrodes of the semiconductor device even if the chip has a bowing or the electrodes of the semiconductor device has a deteriorated coplanarity.

Figure 12:
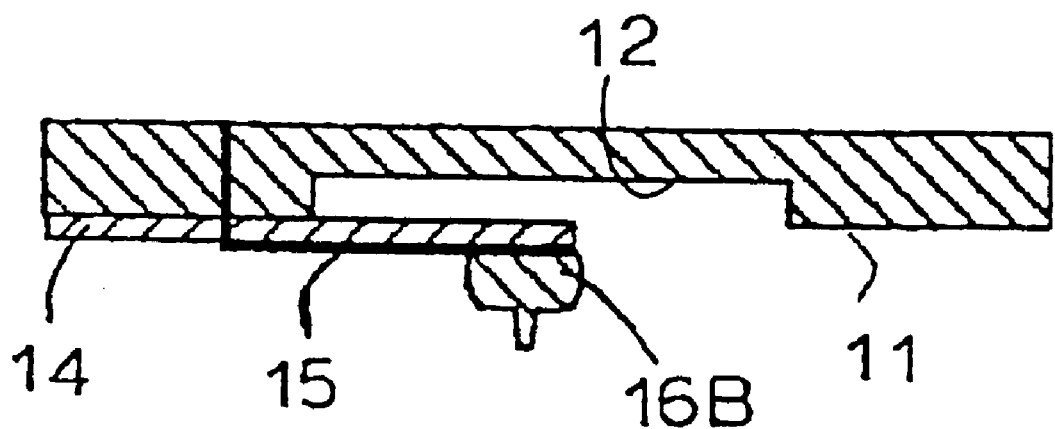
FIG. 12 is a fragmentary cross sectional elevation view illustrative of a novel probe card as a further more modification of a first embodiment according to the present invention.

Yet further modification of the probe card may be made as illustrated in FIG. 12. A substrate 11 has a bottom surface in which a concave portion 12 is formed. An insulation resin film 14 is provided which extends on a bottom surface of the substrate 11 so that the insulation resin film 14 extends under the concave portion 12 and the top portion of the insulation resin film 14 is positioned at the center of the concave portion 12. A probe pattern 15 comprising a conductive film is provided which extends on a bottom surface of the insulation resin film 14. A through hole is formed through both the substrate 11 and the insulation resin film 14 so that the end portion of the conductive film as the probe pattern 15 extends through the through hole and is shown on the top surface of the substrate 11. Bumps 16B are provided on the top portions of the probe pattern 15. The bumps 16B are provided with a stud. The top portion of the insulation resin film 14 comprises a free end positioned under the concave portion 12 of the substrate 11 thereby allowing the top portions of the probe pattern 15 to be pushed into the concave portion 12. The concave portion 12 provides an increased flexibility to laminations of the insulation resin film 14 and the probe pattern 15. The concave portion 12 also increases the defamation stroke of the top portions of the insulation resin film and the probe pattern 15. The concave portion 12 allows the stud bumps 16B to be made into securely contact with the electrodes of the semiconductor device even if the chip has a bowing or the electrodes of the semiconductor device has a deteriorated coplanarity.

Figure 13:
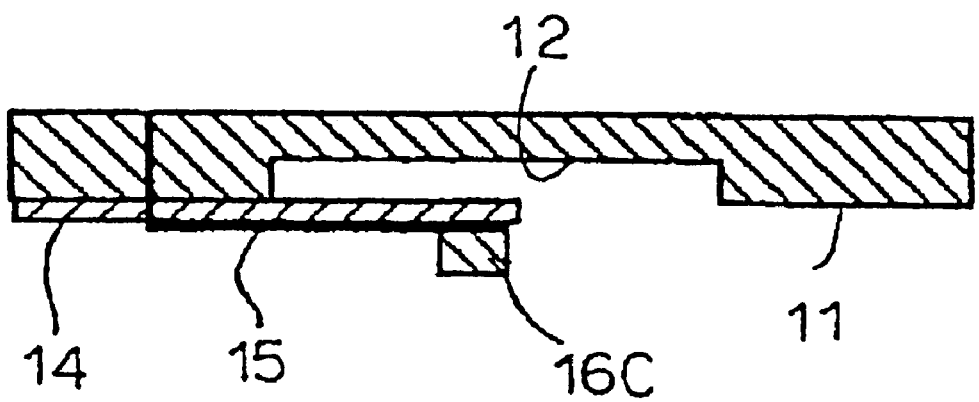
FIG. 13 is a fragmentary cross sectional elevation view illustrative of a novel probe card as moreover modification of a first embodiment according to the present invention.

Still more modification of the probe card may be made as illustrated in FIG. 13. A substrate 11 has a bottom surface in which a concave portion 12 is formed. An insulation resin film 14 is provided which extends on a bottom surface of the substrate 11 so that the insulation resin film 14 extends under the concave portion 12 and the top portion of the insulation resin film 14 is positioned at the center of the concave portion 12. A probe pattern 15 comprising a conductive film is provided which extends on a bottom surface of the insulation resin film 14. A through hole is formed through both the substrate 11 and the insulation resin film 14 so that the end portion of the conductive film as the probe pattern 15 extends through the through hole and is shown on the top surface of the substrate 11. Bumps 16C are provided on the top portions of the probe pattern 15. The bumps 16C are formed by selective plating. The top portion of the insulation resin film 14 comprises a free end positioned under the concave portion 12 of the substrate 11 thereby allowing the top portions of the probe pattern 15 to be pushed into the concave portion 12. The concave portion 12 provides an increased flexibility to laminations of the insulation resin film 14 and the probe pattern 15. The concave portion 12 also increases the defamation stroke of the top portions of the insulation resin film and the probe pattern 15. The concave portion 12 allows the bumps 16C to be made into securely contact with the electrodes of the semiconductor device even if the chip has a bowing or the electrodes of the semiconductor device has a deteriorated coplanarity.

Figure 14:
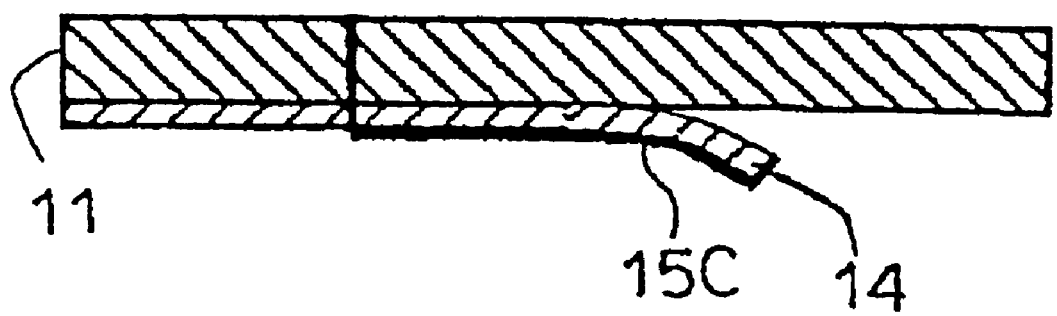
FIG. 14 is a fragmentary cross sectional elevation view illustrative of a novel probe card in a second embodiment according to the present invention.
Figure 16:
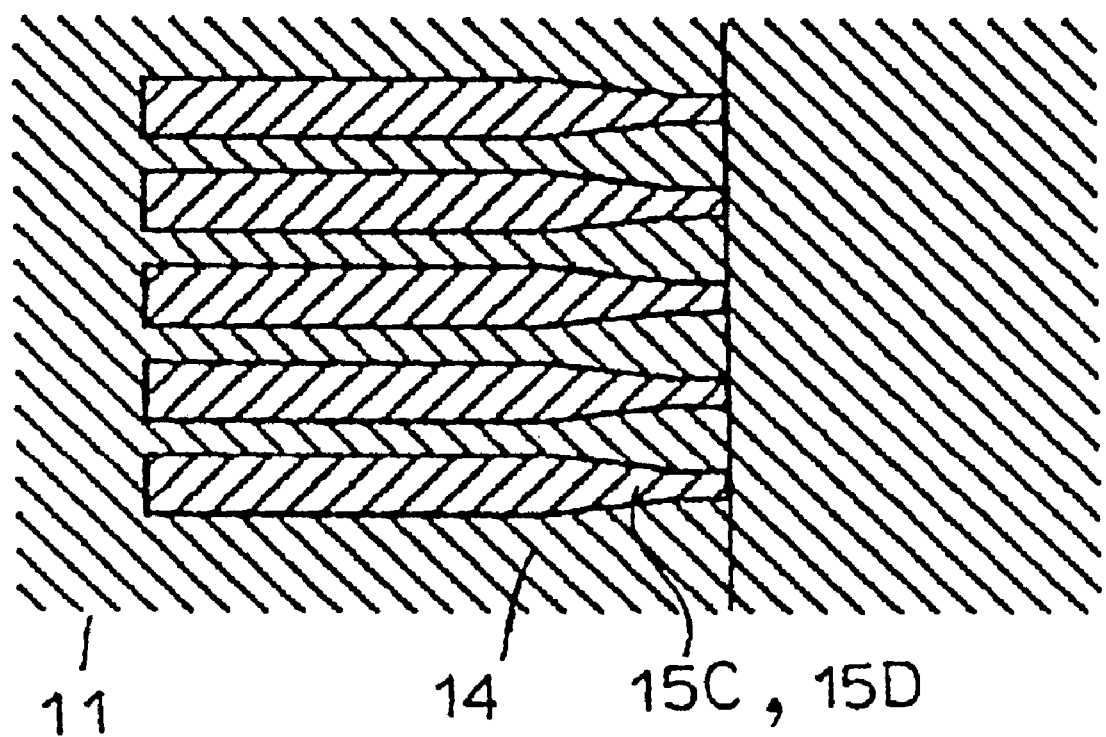
FIG. 16 is a fragmentary plan view illustrative of a novel probe card in a second embodiment according to the present invention.

A second embodiment according to the present invention will be described, in which a novel probe card is provided. As illustrated in FIGS. 14 and 16, a substrate 11 has no concave portion. The probe card has no cavity portion. The substrate 11 has a flat bottom surface. An insulation resin film 14 is provided, which extends over the flat bottom surface of the substrate 11. The insulation resin film 14 has a side region which is arched so that the edge of the insulation resin film 14 becomes apart from the bottom surface of the substrate 11. The arched side region of the insulation resin film 14 makes a space between the side portion of the insulation resin film 14 and the flat and leveled bottom surface of the substrate 11. Probe patterns 15C are formed on a bottom surface of the insulation resin film 14. Each of the probe patterns 15C has a tapered portion which extends on the bottom surface of the arched side region of the insulation resin film 14 whereby the tapered portion of the probe pattern 15C is also arched so that the top of the tapered portion is made apart from the bottom surface of the substrate 11. No bumps are provided at the top of the tapered portion of each the probe pattern. The top of the tapered portion of each the probe pattern has a lowest level so that the top of the tapered portion of each the probe patterns is made into contact with electrodes of the semiconductor device. The laminations of the arched side portion of the insulation resin film 14 and the arched and tapered portions of the probe patterns 15C are flexible and can be so deformed that the tops of the tapered portions of the probe patterns 15C come close to the bottom surface of the substrate 11. The arched and tapered portions of the probe patterns 15C ensures a large deformation stroke of the tops of the tapered portion of the probe patterns 15C. The arched side portion of the insulation resin film 14 has a sufficient elastic force thereby allowing the tops of the tapered portions of the probe patterns 15C to be made into securely contact with the electrodes of the semiconductor device even if the chip has a bowing. Namely, the space between the side portion of the insulation resin film 14 and the flat and leveled bottom surface of the substrate 11 allows the tops of the tapered and arched portions of the probe patterns 15C to have a sufficiently large movable stroke. This allows the tops of the tapered portions of the probe patterns 15C to be made into securely contact with the electrodes of the semiconductor device even if the chip has a relatively large bowing. The deformation stroke of the tops of the deformation stroke is controllable by controlling the degree of the arching of the probe pattern.

Figure 15:
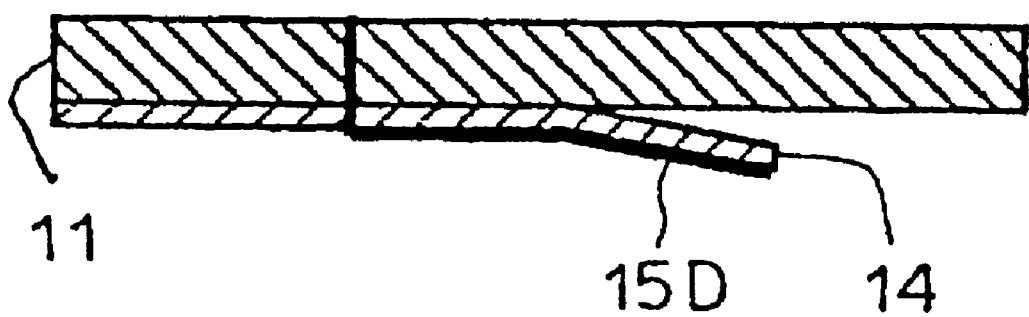
FIG. 15 is a fragmentary cross sectional elevation view illustrative of a novel probe card as a modification of a second embodiment according to the present invention.

A modification of the above probe card may be made as illustrated in FIGS. 15 and 16. A substrate 11 has no concave portion. The probe card has no cavity portion. The substrate 11 has a flat bottom surface. An insulation resin film 14 is provided, which extends over the flat bottom surface of the substrate 11. The insulation resin film 14 has a side region of a flat and sloped-down bottom face which has an angle to the leveled bottom surface of the substrate 11 so that the edge of the insulation resin film 14 becomes apart from the bottom surface of the substrate 11. Namely, the insulation resin film 14 is bent at a boundary between its center region and the side region. Probe patterns 15D are formed on a bottom surface of the insulation resin film 14. Each of the probe patterns 15D has a tapered portion which extends on the bottom surface of the arched side region of the insulation resin film 14 whereby the tapered portion of the probe pattern 15D extends on the flat and sloped-down bottom face of the side region of the insulation resin film 14 so that the top of each the tapered portion is made apart from the bottom surface of the substrate 11. The flat and sloped down face side region of the insulation resin film 14 makes a space between the side portion of the insulation resin film 14 and the flat and leveled bottom surface of the substrate 11. No bumps are provided at the top of the tapered portion of each the probe patterns 15D. The top of the tapered portion of each the probe patterns 15D has a lowest level so that the top of the tapered portion of each the probe patterns 15D is made into contact with electrodes of the semiconductor device. The laminations of the bending portion of the insulation resin film 14 and the bending portions of the probe patterns 15D are flexible and can be so deformed that the tops of the tapered portions of the probe patterns 15C come close to the bottom surface of the substrate 11. The bending portions of the probe patterns 15D ensure a large deformation stroke of the tops of the tapered portion of the probe patterns 15D. The bending portion of the insulation resin film 14 has a sufficient elastic force thereby allowing the tops of the tapered portions of the probe patterns 15D to be made into securely contact with the electrodes of the semiconductor device even if the chip has a bowing. Namely, the space between the flat and sloped down face of the side portion of the insulation resin film 14 and the flat and leveled bottom surface of the substrate 11 allows the tops of the tapered and sloped down portions of the probe patterns 15D to have a sufficiently large movable stroke. This allows the tops of the tapered portions of the probe patterns 15D to be made into securely contact with the electrodes of the semiconductor device even if the chip has a relatively large bowing. The deformation stroke of the tops of the deformation stroke is controllable by controlling the degree of the bending of the probe pattern.

Subsequently, a method of forming the above novel probe card illustrated in FIGS. 6 and 7 will be described with reference to FIGS. 17A through 17D.

With reference to FIG. 17A, interconnections are printed on a glass ceramic green sheet to form a layered substrate 11 having a thickness of 1.5 mm and a plan size of 15 cm×15 cm. Through holes 18 are formed in the substrate 11. The through holes 18 are aligned in matrix within each of four squared sections separated from each other as illustrated in FIG. 17A. By slicing saw, concave grooves 12 are formed in matrix to form low concave grooves and column concave grooves so that the concave grooves 12 define islands aligned in matrix. Each of the islands has the holes aligned in matrix. The concave grooves 12 have a depth of 500 micrometers. The concave grooves 12 are located at positions at which tops of probe patterns to be formed later.

With reference to FIG. 17B, a past comprising silver powders and organic vehicles is filled into the concave grooves 12 and then sintered to form a filled body 23. A surface of the sintered filled body 23 is polished to be leveled to the surface of the substrate 11.

Figure 17C:
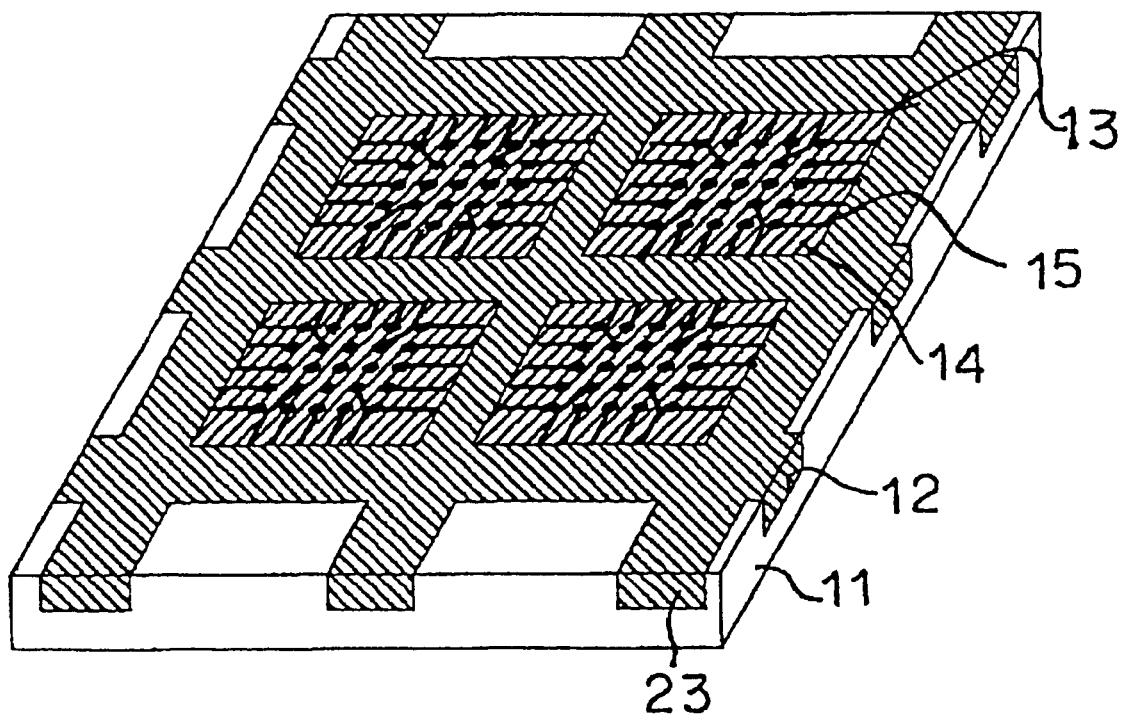

With reference to FIG. 17C, a photo-sensitive polyimide resin film is applied on surfaces of the filled body 23 and the substrate 11. The photo-sensitive polyimide resin film is patterned to form resin films 14. Each of the patterned resin films 14 extends not only over the island of the substrates 11 but also over the filled body 23 but only in a peripheral region to the island of the substrates 11. A photo-resist is applied on the surface of the resin films 14 and on the filled body 23. The applied photo-resist film is then patterned by photo-lithography to form photo-resist patterns. A copper film is plated on the surface of the substrate 11 by use of the photo-resist pattern as a mask. The photo-resist pattern is then removed. As a result, probe patterns 1.5 are formed by lift-off method. The probe patterns 15 extend over the filled body 23 and within the through holes 18 so that the probe patterns 15 are electrically connected to interconnections. An insulation film is then formed over the surfaces of the probe films 13 and the filled body 23. A photo-sensitive polyimide resin film is formed over the insulation film. The photo-sensitive polyimide resin film is then patterned by a photo-lithography to form a photo-resist pattern. By photo-lithography using the photo-resist pattern as a mask, the insulation film is patterned whereby only top portions of the probe patterns 15 are shown through apertures of the insulation film. A rosin-core solder and an eutectic solder are supplied onto the top portions of the probe patterns 15. The supplied solders are then reflowed at a temperature of 230° C. to form bumps 16. Surfaces of the bumps 16 are further polished by a thickness of 10 micrometers by a sand paper of #1000 to remove any variation in height of the bumps 16 but form fine convex and concave on the surfaces of the bumps 16. Nickel plating layers are further formed over the polished surfaces of the bumps 16. Gold plating layers are furthermore formed over the nickel plating layers. The nickel plating layers have a thickness of 3 micrometers. The gold plating layers have a thickness of 0.3 micrometers.

With reference to FIG. 17D, an anode is electrically connected to the filed body 23. A carbon cathode electrode is prepared. The substrate 11 is immersed in a diluted nitric acid and a voltage of 2V is applied across the anode and cathode to cause the filled body 23 to be melted whereby the filled body 23 is removed from the substrate 11. As a result, the resin films 14, the probe patterns 15, the surface insulation films 17 and the bumps 16 remain over the surfaces of the islands of the substrate 11 thereby a probe card being formed. The probe card having been prepared has the probe films 13 aligned in matrix and each of the probe films 13 has a pattern as illustrated in FIG. 18.

As a modification of the above method of forming the probe card may be made as illustrated in FIG. 19. It is possible to form probe films 13 comprising the resin films 14 and the probe patterns 15 formed on the resin films 14 in a different process from the process illustrated in FIG. 17A. The probe films 13 are aligned on the islands of the substrate 11. Probe patterns 15 are adhered to the through holes 18 by an anisotropic conductive adhesive so that the probe patterns 15 are electrically connected to the through holes 18.

A third embodiment according to the present invention will be described with reference to FIGS. 20 and 21, wherein a novel probe cad is provided. A substrate 11 has a bottom surface in which a concave portion 12 is formed. The substrate may comprise a ceramic substrate 11. The concave portion 12 is rectangular-shaped. A insulation resin film 14 is formed, which extends on the bottom surface of the substrate 11 so that the insulation resin film 14 extends under the concave portion 12 to form a cavity defined between the concave portion and the insulation resin film 14. Through holes 18 are formed in the substrate 11 and the insulation resin film 14. Probe patterns 15 are provided, which extend on a bottom surface of the insulation resin film 14. The probe patterns 15 also extend through the through holes 18 so that ends of the probe patterns 15 are shown on the top surface of the substrate 11. Interconnection patterns 19 are provided on the top surface of the substrate 11 so that the interconnection patterns 19 are connected with the ends of the probe patterns 15. In the bottom view, the probe patterns 15 are straight-patterned as illustrated in FIG. 21. The probe patterns 15 are aligned on the bottom surface of the insulation resin film to make a plurality of pairs of the probe patterns 15 so that the tops of the paired probe patterns 15 face to each other but are separated at a distance. A plurality of the paired probe patterns 15 are aligned at a constant pitch "f" so that adjacent pairs of the probe patterns 15 are distanced from each other. A surface insulation resin film 17 is further provided which extends on the bottom surfaces of the probe patterns 15 and on the bottom surface of the insulation resin film 14. Openings are formed in the surface insulation resin film 17 so that the openings are positioned under the top portions of the probe patterns 15 whereby the top portions of the probe patterns 15 are shown through the openings. Bumps 16 are provided within the openings formed in the surface insulation resin film 17 and on the top portions of the probe patterns 15. The height of the bumps 16 is larger than a thickens of the surface insulation resin film 17 so that the bumps 16 are protruded from the openings formed in the surface insulation resin film 17. Further, slits 21 are provided in laminations of the surface insulation resin film 17 and the insulation resin film 14 so that the slits 21 extend between the adjacent pairs of the probe patterns 15 along the longitudinal direction of the robe patterns 15. Along the longitudinal direction of the probe patterns 15, each of the slits 21 extends in opposite directions from a center region defined between alignments of the bumps 16 provided at the top portions of the paired probe patterns 15, through intermediate positions between the adjacent two on each the alignments of the bumps 16 up to positions corresponding to the opposite edges of the cavity so that the each slit 21 has the same length as the cavity.

The cavity defined by the concave portion 12 of the substrate 11 and the insulation resin film 14 allows the laminations of the insulation resin film 14, the probe patterns 15 and the surface insulation resin film 17 to be deformed into the cavity. Namely, the cavity provides large flexibility to the laminations of the insulation resin film 14, the probe patterns 15 and the surface insulation resin film 17. The slits 21 extending between the adjacent pairs of the probe patterns 15 allow each pair of the probe patterns 15 to be deformed individually and separately. A combination of the cavity and the slits 21 allows the bumps 16 on the top portions of the probe patterns 15 to have sufficiently large defamation stroke whereby the bumps 16 may be made into securely contact with the electrodes of the semiconductor device.

In this third embodiment, a distance between the top portions of the paired probe patterns 15 is set at 200 micrometers. Namely, the distance between the bumps 16 formed on the top portions of the paired probe patterns 15 is 200 micrometers. An effective length "c" of each the probe patterns 15 is defined to be a length of its part extending under the cavity or the effective length "c" of each the probe patterns 15 is the length from its position corresponding to the edge of the cavity to the top portion. Since the paired probe patterns 15 under the cavity are symmetrical, the length of the cavity or the width "a" of the concave portion 12 is 2×c+200 micrometers. The length "h" of the slits 21 is equal to the length "c" of the cavity. The height "e" of the bumps 16 is 50 micrometers. A diameter of the bumps 16 is 90 micrometers. Plural pairs of the probe patterns 15 are aligned in a pitch "f" of 120 micrometers. A thickness "b" of the probe patterns 15 is 5 micrometers. A width "g" of each the probe patterns 15 is 80 micrometers. A length of each the probe patterns 15 is 1 millimeter. A thickness "e" of the insulation resin film 14 is 10 micrometers. A size of the probe card is 15 cm×15 cm. The probe card has a probe region in which probe patterns 15 are provided. A size of the probe region is 13 cm ×13 cm.

Under the above conditions, the followings were confirmed.

It was confirmed that if the above substrate 11 comprises a substrate in which alumina interconnections are formed therein, then the characteristics of the probe card remain unchanged.

It was further confirmed that if the above substrate 11 comprises a substrate in which aluminum nitride interconnections are formed therein, then the characteristics of the probe card remain unchanged.

It was further confirmed that if the above substrate 11 comprises a glass epoxy substrate, then the probe card is capable of performing stable probing operation in an area of 10 cm×10 cm.

It was further more confirmed that if the insulation resin film comprises a film made of photo-sensitive benzocyclobutene, the probing life time of the probe card is 100 thousands times or more and a good connectivity is kept. The photo-sensitive benzocyclobutene film has a lower film strength than the polyimide film.

It was still further confirmed that if the insulation resin film comprises a film made of photo-sensitive epoxy, the probing life time of the probe card is 100 thousands times or more and a good connectivity is kept. The photo-sensitive epoxy film has a lower film strength than the polyimide film.

It was yet further confirmed that if the probe card has a structure with slits as illustrated in FIG. 6, the probing life time of the probe card is 100 thousands times or more and a good connectivity is kept. As compared to the probe card free of slit, the probe card provided with the slits has a larger deformation stroke and a higher flexibility.

It was also confirmed that if the probe card has a structure with probe patterns of tapered top portions of 60 micrometers width as illustrated in FIG. 16, the probing life time of the probe card is 100 thousands times or more and a good connectivity is kept. As compared to the probe card free of tapered shape, the probe card provided with the slits has a larger deformation stroke and a higher flexibility.

It was also confirmed that if the probe card has a structure with probe patterns comprising a copper film and a nickel film of 5 micrometers plated on the copper film as illustrated in FIG. 9, the probing life time of the probe card is 100 thousands times or more and a good connectivity is kept. As compared to the probe card free of tapered shape, the probe card provided with the additional nickel plating film has a higher elastic force with a larger deformation stroke and a higher flexibility.

It was also confirmed that if the probe card has a structure with probe patterns as illustrated in FIG. 10, the probing life time of the probe card is 100 thousands times or more and a good connectivity is kept.

It was also confirmed that if the probe card has a structure with probe patterns as illustrated in FIG. 16B, the probing life time of the probe card is 100 thousands times or more and a good connectivity is kept.

It was also confirmed that if the probe card has a structure with probe patterns with stud bumps 16B as illustrated in FIG. 12, the probing life time of the probe card is 100 thousands times or more and a good connectivity is kept.

It was also confirmed that if the probe card has a structure with probe patterns with stud bumps 16C as illustrated in FIG. 12, the probing life time of the probe card is 100 thousands times or more and a good connectivity is kept.

It was also confirmed that if the probe card has a structure with probe patterns as illustrated in FIG. 7, the probing life time of the probe card is 100 thousands times or more and a good connectivity is kept.

It was also confirmed that if the probe card has a structure with probe patterns as illustrated in FIG. 8, the probing life time of the probe card is 100 thousands times or more and a good connectivity is kept.

It was also confirmed that if the probe card has a structure with probe patterns as illustrated in FIG. 14, the probing life time of the probe card is 100 thousands times or more and a good connectivity is kept.

It was also confirmed that if the probe card has a structure with probe patterns as illustrated in FIG. 15, the probing life time of the probe card is 100 thousands times or more and a good connectivity is kept.

The following table 1 shows probe connectivity and probe life time when the length of the probe and the height of the bumps are varied, wherein ○ represents that all of the probes are contacted with the electrodes of the semiconductor device, Δ represents that some of the probes are not contacted with the electrodes of the semiconductor device, and × represents that no probes are contacted with the electrodes of the semiconductor device.

TABLE 1

| Length of Probe ($\mu$m) | Height of Bumps ($\mu$m) | Connectivity | Life Time of Probe (Times) |
| --- | --- | --- | --- |
| 100 | 10 | Δ | 100 |
| 100 | 20 | Δ | 10 |
| 100 | 50 | X | 0 |
| 100 | 150 | X | 0 |
| 100 | 200 | X | 0 |
| 200 | 10 | Δ | 1000 |
| 200 | 20 | ○ | 100 |
| 200 | 50 | X | 10 |
| 200 | 150 | X | 0 |
| 200 | 200 | X | 0 |
| 1000 | 10 | Δ | 100000 |
| 1000 | 20 | Δ | 100000 |
| 1000 | 50 | ○ | 100000 |
| 1000 | 150 | ○ | 100000 |
| 1000 | 200 | Δ | 10000 |
| 3000 | 10 | Δ | 100000 |
| 3000 | 20 | Δ | 100000 |
| 3000 | 50 | Δ | 100000 |
| 3000 | 150 | ○ | 100000 |
| 3000 | 200 | Δ | 100000 |
| 6000 | 10 | Δ | 100000 |
| 6000 | 20 | Δ | 100000 |
| 6000 | 50 | Δ | 100000 |
| 6000 | 150 | Δ | 100000 |
| 6000 | 200 | Δ | 100000 |

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A probe card comprising:

a substrate;

a flexible insulation film attached to a first surface of said substrate except at a first part of said substrate where said insulation film is spaced from said substrate to define a cavity between said substrate and said insulation film, said insulation film having a first unitary tongue that extends over said first part of said substrate and that flexes into said cavity;

plural first probe tips on a first side of said insulation film opposite said substrate and extending along an unbroken edge of said first unitary tongue that flexes into said cavity; and plural first leads that each comprises a first electrical connector on the first side of said insulation film that extends across said first unitary tongue with a first end contacting a respective one of said probe tips and a second end spaced from said first unitary tongue, and a contact pad contacting said second end of said first electrical connector.

2. The probe card of claim 1, said insulation film further comprising a second unitary tongue that extends over said first part of said substrate and that flexes into said cavity, and further comprising plural second probe tips on the first side of said insulation film and extending along an unbroken edge of said second unitary tongue that flexes into said cavity, and plural second leads that each comprises a second electrical connector on the first side of said insulation film that extends across said second unitary tongue with a first end contacting a respective one of said second probe tips and a second end spaced from said second unitary tongue, and a contact pad contacting said second end of said second electrical connector.

3. The probe card of claim 2, wherein said edges of said first and second unitary tongues that flex into said cavity are spaced from each other by a gap that opens into said cavity.

4. The probe card as claimed in claim 1, wherein said first part of said substrate has a concave portion.

5. The probe card as claimed in claim 4, wherein said concave portion is rectangular-shaped.

6. The probe card as claimed in claim 4, wherein said concave portion is arch-shaped.

7. The probe card as claimed in claim 1, wherein said first probe tips are bumps.

8. The probe card as claimed in claim 7, wherein said bumps are ball bumps.

9. The probe card as claimed in claim 7, wherein said bumps are stud bumps.

10. The probe card as claimed in claim 7, wherein said bumps are selective plating bumps.

11. The probe card as claimed in claim 1, wherein each said first connector has an unchanged width.

12. The probe card as claimed in claim 1, further comprising a conductive film selectively provided on said first leads to increase an elastic force of a lamination of said insulation film, said first leads and said conductive film.

13. The probe card as claimed in claim 2, wherein each said second connector has an unchanged width.

14. The probe card as claimed in claim 12, where said conductive film is selectively provided on said second leads to increase an elastic force of a lamination of said insulation film, said second leads and said conductive film.

15. The probe card as claimed in claim 1, wherein said insulation film comprises:

a first portion which is in contact with said first surface of said substrate; and a second portion which is distanced from said first surface of said substrate so that a distance between said second portion of said insulation film and said first surface of said substrate is gradually increased toward a side edge of said insulation film.

16. The probe card as claimed in claim 15, wherein said second portion of said insulation film is arched.

17. The probe card as claimed in claim 15, wherein said insulation film is bent at a boundary between said first and second portions so that a surface of said second portion of said insulation film is tilted from said first surface of said substrate.

18. A probe card comprising:

a substrate having first and second surfaces, said first surface having a concave portion which separates opposite side regions of said first surface;

a flexible insulation film extending on said first surface of said substrate comprising said concave portion and said opposite side regions, said insulation film having a first surface in contact with said first surface of said substrate, to define a cavity between said concave portion of said substrate and said first surface of said insulation film, a center region of said insulation film flexibly moving into said cavity; and a plurality of pairs of probe patterns on a second surface of said insulation film at said center region and aligned in parallel to each other at a constant pitch in a direction perpendicular to a longitudinal direction of said probe patterns, each said pair of said probe patterns being aligned on a line parallel to said longitudinal direction of said probe patterns, top portions of each said pair of said probe patterns facing each other but being spaced apart by an intermediate gap that opens into said cavity near a center of said cavity, said center region having two parts separated by said intermediate gas, each of said two parts being on unitary tongue that flexes as one into said cavity.

19. The probe card as claimed in claim 18, wherein said concave portion is rectangular-shaped.

20. The probe card as claimed in claim 18, wherein said concave portion is arch-shaped.

21. The probe card as claimed in claim 18, wherein said probe patterns are symmetrical to said intermediate gap.

22. The probe card as claimed in claim 18, wherein said top portions of said probe patterns are tapered.

23. The probe card as claimed in claim 18, wherein bumps are provided at said top portions of said probe patterns.

24. The probe card as claimed in claim 23, wherein said bumps are ball bumps.

25. The probe card as claimed in claim 23, wherein said bumps are stud bumps.

26. The probe card as claimed in claim 23, wherein said bumps are selective plating bumps.

27. The probe card as claimed in claim 18, wherein said probe patterns have an unchanged width.

28. The probe card as claimed in claim 18, further comprising conductive films selectively provide on said probe patterns to increase an elastic force of laminations of said insulation film, said probe patterns and said conductive films.

29. The probe card as claimed in claim 18, further comprising an additional insulation film provided to cover said probe patterns to increase an elastic force of laminations of said insulation film, said probe patterns and said additional insulation film.

* * * * *